(12) United States Patent
Iwata et al.

(10) Patent No.: US 7,544,993 B2
(45) Date of Patent: Jun. 9, 2009

(54) SEMICONDUCTOR STORAGE DEVICE AND PORTABLE ELECTRONIC EQUIPMENT

(75) Inventors: Hiroshi Iwata, Nara (JP); Akihide Shibata, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 352 days.

(21) Appl. No.: 10/540,019

(22) PCT Filed: Dec. 19, 2003

(86) PCT No.: PCT/JP03/16309

§ 371 (c)(1), (2), (4) Date: Jun. 22, 2005

(87) PCT Pub. No.: WO02/067320

PCT Pub. Date: Aug. 29, 2002

(65) Prior Publication Data

US 2006/0244070 A1 Nov. 2, 2006

(30) Foreign Application Priority Data

Dec. 27, 2002 (JP) .............. 2002-379737
Nov. 27, 2003 (JP) .............. 2003-397660

(51) Int. Cl.
*H01L 29/792* (2006.01)

(52) U.S. Cl. .................... 257/324; 257/314
(58) Field of Classification Search ............. 257/324, 257/314

See application file for complete search history.

(56) References Cited

U.S. PATENT DOCUMENTS

2004/0232475 A1   11/2004   Kataoka et al.

2006/0008992 A1 * 1/2006 Shukuri ............. 438/264
2006/0208312 A1 * 9/2006 Iwata et al. ......... 257/324

FOREIGN PATENT DOCUMENTS

| JP | 5-81072 B2 | 11/1993 |
|---|---|---|
| JP | 5-304277 A | 11/1993 |
| JP | 9-97849 A | 4/1997 |
| JP | 9-116119 A | 5/1997 |
| JP | 2001-156188 A | 6/2001 |
| JP | 2001-230332 A | 8/2001 |
| JP | 2001-512290 A | 8/2001 |
| TW | 457712 | 10/2001 |
| WO | WO-02/067320 A1 | 8/2002 |

* cited by examiner

*Primary Examiner*—Long Pham
(74) *Attorney, Agent, or Firm*—Birch, Stewart, Kolasch & Birch, LLP

(57) ABSTRACT

A semiconductor storage device has memory function bodies (261, 262) having a function to retain electric charges, which are formed on opposite sides of a single gate electrode (217) provided on a semiconductor layer (211) with a gate insulation film (214) disposed therebetween. Each memory function body includes a charge retention film (242) having a charge storage region (250). The charge storage regions (250) exist over part of the channel region (273) and part of diffusion regions (212, 213) on both sides of the channel region. Because the memory function bodies are formed on both sides of the gate electrode, independently of the gate insulation film, 2-bit operations are possible. Because the memory function bodies are separated from each other by the gate electrode, interference during rewrite operation is effectively suppressed. Also, short-channel effect is suppressed through thinning of the gate insulation film. Miniaturization of memory elements is thus facilitated.

31 Claims, 25 Drawing Sheets

Fig. 37

| Year | 2003 | 2005 | 2007 | 2010 | 2013 |
|---|---|---|---|---|---|
| MPU 1/2 Pitch [nm] | 107 | 80 | 65 | 50 | 35 |
| L (Flash NOR) [nm] | 220 | 200 | 190 | 170 | 140 |
| L (Logic) [nm] | 45 | 32 | 25 | 18 | 13 |
| L (Memory) [nm] | 45 | 32 | 25 | 18 | 13 |
| Wsw[nm] | 66 | 47 | 40 | 32 | 27 |
| Wex[nm] | — | — | 3 | 6 | 8 |
| Woff[nm] | 20 | 14 | 14 | 14 | 14 |
| Ssw[nm] | 144 | 114 | 90 | 68 | 38 |

Fig. 38

| Year | 2003 | 2005 | 2007 | 2010 | 2013 |
|---|---|---|---|---|---|
| MPU 1/2 Pitch [nm] | 107 | 80 | 65 | 50 | 35 |
| L (Flash NOR) [nm] | 220 | 200 | 190 | 170 | 140 |
| L (Logic) [nm] | 45 | 32 | 25 | 18 | 13 |
| L (Memory) [nm] | 107 | 80 | 65 | 50 | 35 |
| Wsw[nm] | 66 | 47 | 40 | 32 | 27 |
| Wex[nm] | — | — | 3 | 6 | 8 |
| Woff[nm] | 20 | 14 | 14 | 14 | 14 |
| Ssw[nm] | 82 | 66 | 50 | 36 | 16 |

Fig. 39

| Year | 2003 | 2005 | 2007 | 2010 | 2013 |
|---|---|---|---|---|---|
| MPU 1/2 Pitch [nm] | 107 | 80 | 65 | 50 | 35 |
| L (Flash NOR) [nm] | 220 | 200 | 190 | 170 | 140 |
| L (Logic) [nm] | 45 | 32 | 25 | 18 | 13 |
| L (Memory) [nm] | 82 | 66 | 50 | 36 | 16 |
| Wsw[nm] | 66 | 47 | 40 | 32 | 27 |
| Wex[nm] | — | — | 3 | 6 | 8 |
| Woff[nm] | 20 | 14 | 14 | 14 | 14 |
| Ssw[nm] | 107 | 80 | 65 | 50 | 35 |

SEMICONDUCTOR STORAGE DEVICE AND PORTABLE ELECTRONIC EQUIPMENT

This application is the US national phase of International Application PCT/JP2003/016309 filed Dec. 19, 2003, which designated the US. PCT/JP2003/016309 claims priority to JP Patent Applications No. 2002-379737 filed Dec. 27, 2002 and No. 2003-397660 filed Nov. 27, 2003. The entire contents of these applications are incorporated herein by reference.

TECHNICAL FIELD

The present invention relates to a semiconductor storage device and portable electronic equipment. More particularly, the present invention relates to a semiconductor storage device in which field-effect transistors having memory function bodies are arrayed, each function body having a function of holding electric charges or polarization, and portable electronic equipment that employs such a semiconductor storage device.

BACKGROUND OF THE INVENTION

The following will describe a flash memory as a representative example of conventional nonvolatile memories.

In this flash memory, as shown in FIG. 41, a floating gate 902, an insulation film 907 and a word line (control gate) 903 are formed in this order via a gate insulation film 908 on a semiconductor substrate 901, and a source line 904 and a bit line 905 are formed on both sides of the floating gate 902, constituting a memory cell. Around this memory cell are formed element isolation regions 906 (refer to Japanese Patent Laid-Open Publication No. HEI 5-304277).

The flash memory cell retains storage as the quantity of charge in the floating gate 902. In the memory cell array constructed by arranging the memory cells, the desired memory cell can be subjected to rewrite and read operations by selecting the specified word line and bit line and applying a prescribed voltage to the lines.

FIG. 42 schematically shows a drain current (Id) vs. gate voltage (Vg) characteristic when the quantity of charges in the floating gate 902 changes. As the quantity of charges in the floating gate increases, the threshold voltage increases, and the Id-Vg curve is displaced roughly parallel in a direction in which the gate voltage Vg increases with respect to same drain current Id, resulting in a curve shown in broken line.

However, in the aforementioned conventional flash memory that has the floating gate between the word line (gate electrode) and the channel region, because it is necessary to prevent leakage of electric charges from the floating gate 902, it has been difficult to reduce the thickness of an insulation film 907 that isolates the floating gate 902 from the word line 903 and an insulation film 908 that isolate the floating gate 902 from the channel region. Therefore, it has been difficult to reduce the thickness of a practically gate insulation film, and this has hindered the miniaturization of the memory cell.

SUMMARY OF THE INVENTION

Accordingly, an object of the present invention is to provide a nonvolatile memory that is easy to miniaturize.

In order to accomplish the above object, a semiconductor storage device according to an aspect of the present invention includes a semiconductor layer; a single gate electrode formed on the semiconductor layer, with a gate insulation film disposed therebetween; a channel region arranged under the gate electrode; diffusion regions arranged on opposite sides of the channel region; and memory function bodies formed on opposite sides of the gate electrode and having a function to retain electric charges.

Herein, the term "single gate electrode" means a gate electrode constituted of a monolayer or multilayer conductive film and formed in one piece, but not in a plurality of separate pieces.

According to the above arrangement, the memory function bodies are formed independently of the gate insulating film and provided on both sides of the gate electrode. Thus, the device is able to perform a two-bit operation. Furthermore, because the memory function bodies are separated from each other by the gate electrode, interference during rewrite can effectively be prevented. Further, because the gate insulating film is independent of the memory function bodies, the gate insulating film is made thinner, so that short channel effect can be easily prevented. Thus, further miniaturization of a memory element is facilitated.

A semiconductor storage device according to a second aspect of the present invention includes a semiconductor layer; a single gate electrode formed on the semiconductor layer, with a gate insulation film disposed therebetween; a channel region arranged under the gate electrode; diffusion regions arranged on opposite sides of the channel region; and two charge storage regions. Each of the charge storage regions is in a shape of a film parallel to a surface of the semiconductor layer and exists over part of the channel region and part of the corresponding diffusion region, straddling a boundary therebetween.

According to the above arrangement, the gate electrode is formed on the semiconductor layer, with the gate insulation film disposed therebetween, and each charge storage region exists over part of the channel region and part of the corresponding diffusion region, straddling a boundary therebetween. Thus, the device is able to perform a two-bit operation, and interference during rewrite can effectively be prevented. Also, the gate insulating film is made thinner, so that short channel effect can be prevented. Further, because each of the two charge storage regions exists over part of the channel region and part of the corresponding diffusion region in a straddling manner, the semiconductor storage device is able to perform a high-speed read operation. In addition, because the charge storage regions are in a shape of a film parallel to a surface of the semiconductor layer, the semiconductor storage device provides an improved reliability and an improved rewrite speed.

A semiconductor storage device according to a third aspect of the present invention includes a plurality of memory elements arranged along a word line, and two memory function bodies having a function to retain electric charges are formed so as to extend along the word line on opposite sides of the word line. Each of the plurality of memory elements includes a semiconductor layer; part of the word line; a gate insulation film formed between the semiconductor layer and the part of the word line; a channel region arranged under the part of the word line; diffusion regions arranged on opposite sides of the channel region; and part of each of the memory function bodies that exists over part of the channel region and part of the corresponding diffusion region, straddling a boundary therebetween.

This arrangement corresponds to an array of a plurality of the semiconductor storage devices according to the first aspect of the present invention, and has functions and effects similar to those of the device according to the first aspect. In addition to that, because the word line and the memory function bodies are shared by the plurality of memory elements, an area occupied by each memory element is reduced, so that a higher packing density of the memory elements is achievable.

In one embodiment, the word line consists of a single word line, the memory function bodies are arranged only on both sides of the single word line, and the memory function bodies are each comprised of one or more insulative materials.

Herein, the term "single word line" means a word line constituted of a monolayer or multilayer conductive film and formed in one piece, but not in a plurality of separate pieces.

According to the above arrangement, because the memory function bodies are formed of one or more insulative materials and arranged only on both sides of the single word line, the fabrication process for the semiconductor stsorage device having the memory elements arrayed is simplified, which in turn provides improved yields. Further, as compared with a case in which the word line consists of a plurality of separate pieces, miniaturization of the memory elements is easier, so that the scase of integration will be increased. In addition, the write operation is well performed.

In one embodiment, a word line to be selected when information is rewritten to the memory element is only the single word line.

In the embodiment, the number of word lines that are required for the memory operations is made minimum. Thus, a memory cell array can be packed at a higher density.

In one embodiment, each of the memory function bodies is comprised of one or more insulative materials, and at least part of each memory function body is formed so as to overlap with part of the corresponding diffusion region.

In the embodiment, the memory function bodies are comprised of one or more insulative materials and formed on both sides of the single gate electrode such that at least part of each memory function body overlaps with part of the corresponding diffusion region. This arrangement can simplify the memory element fabrication process and thus increase yields. Further, miniaturization of the memory elements is easier, and the write operation to the memory elements is well performed.

In one embodiment, the semiconductor layer is comprised of a SOI layer.

In this embodiment, junction capacitance between the diffusion regions and a body region is markedly reduced, which enables the increase of the operation speed of the memory elements and the reduction of power consumption.

In one embodiment, the semiconductor layer includes a well region.

In the embodiment, it is easy to controll electric characteristics (breakdown voltage, junction capacitance, short-channel effect), with the impurity concentration in an area right under the gate insulation film being made optimum in view of the memory operations (rewrite operations and read operations).

In one embodiment, each of the memory function bodies includes a charge retention film having a function of storing electric charges, and an insulator.

In this embodiment, it is possible to prevent dissipation of electric charges and improve the memory retention characteristic. Also, it is possible to properly reduce the volume of the charge retention film, as compared with a case in which the memory function body consists of the charge retention film only. Further, the proper reduction of the volume of the charge retention film can restrain migration of the electric charges within the charge retention film, thus suppressing a change in characteristics due to the migration of the charges during the memory retention. Thus, an improved memory retention characteristic is achieved.

In one embodiment, the charge retention film includes a first portion that has a surface roughly parallel to a surface of the gate insulation film.

In the embodiment, it is possible to effectively control easiness of formation of an inversion layer in the offset region with use of an amount of electric charges stored in the charge retention film, thereby enabling increase of memory effect. Because the first portion of the charge retention film is substantially parallel to the surface of the gate insulation film, change of memory effect may be kept relatively small even with a dispersed offset amount, enabling restraint of memory effect dispersion. In addition, because the first portion of the charge retention film is in the shape of a film substantially parallel to the surface of the gate insulation film, upward movement of electric charges is suppressed, and therefore change of characteristics due to the movement of electric charges during memory holding is restrained. Thus, it is possible to obtain a semiconductor storage device having good charge holding characteristics wherein the memory effect is large and less varied.

Note that the "memory effect" means that when a voltage is applied to the gate electrode (word line), a current amount that flows from one of the diffusion layer regions to the other through the channel region is changed in accordance with an electric charge amount held in the charge retention film. The memory effect being large means that the change of the current amount is large.

In one embodiment, the charge retention film includes a second portion extended roughly parallel to a side surface of the gate electrode or the word line.

In this embodiment, the holding characteristic of the device is prevented from deterioration, and at the same time, the rewriting speed can be increased.

In one embodiment, the insulator includes an insulation film that separates the gate electrode or the word line from the second portion of the charge retention film extended roughly parallel to the side surface of the gate electrode or the word line.

In this embodiment, movement of the electric charges between the gate electrode and the second portion, extended roughly parallel to the gate electrode side surface, of the charge retention film is suppressed. Thus, reliability of the semiconductor storage device increases.

In one embodiment, the insulator includes an insulation film that separates the first portion of the charge retention film from the channel region or the semiconductor layer.

In this embodiment, dissipation of charges from the first portion of the charge retention film is suppressed. Therefore, a semiconductor storage device with better holding characteristics is obtainable.

In one embodiment, the insulation film that separates the first portion of the charge retention film from the channel region or the semiconductor layer has a film thickness, which is smaller than a film thickness of the gate insulation film and not smaller than 0.8 nm.

In this embodiment, without deteriorating the voltage withstanding performance or electric strength of the memory, reduction of voltage in the write operation and erase operation or implementing a high-speed write operation and erase operation is enabled. This makes it possible to increase memory effect.

In one embodiment, the insulation film that separates the first portion of the charge retention film from the channel region or the semiconductor layer has a film thickness, which is greater than a film thickness of the gate insulation film and not greater than 20 nm.

In this embodiment, it is possible to improve the holding characteristics without deteriorating the memory short channel effect.

In one embodiment, each diffusion region is effectively offset with respect to the gate electrode or the word line. Both of the diffusion regions being offset can much more effectively suppress the short channel effect than only one of the diffusion regions being offset. Furthermore, fabrication process steps, which would be necessary when only one diffusion region is offset, are dispensed with. Accordingly, margins, which would be necessary when such process steps are carried out, are also dispensed with.

Each memory function body may include an insulation film formed on a remotest side from the gate electrode (or the word line) in order to secure a prescribed amount of offset of each diffusion region. This arrangement enables further miniaturization with a sufficient memory effect being maintained.

Portable electronic equipment according to a fourth aspect of the present invention includes the semiconductor storage device having any of the arrangements as described above.

BRIEF DESCRIPTION OF THE DRAWINGS

FIG. 37 shows an example of the scaling of the integrated circuit;

FIG. 38 shows another example of the scaling of the integrated circuit;

FIG. 39 shows still another example of the scaling of the integrated circuit;

DETAILED DESCRIPTION OF THE INVENTION

Figure 1:
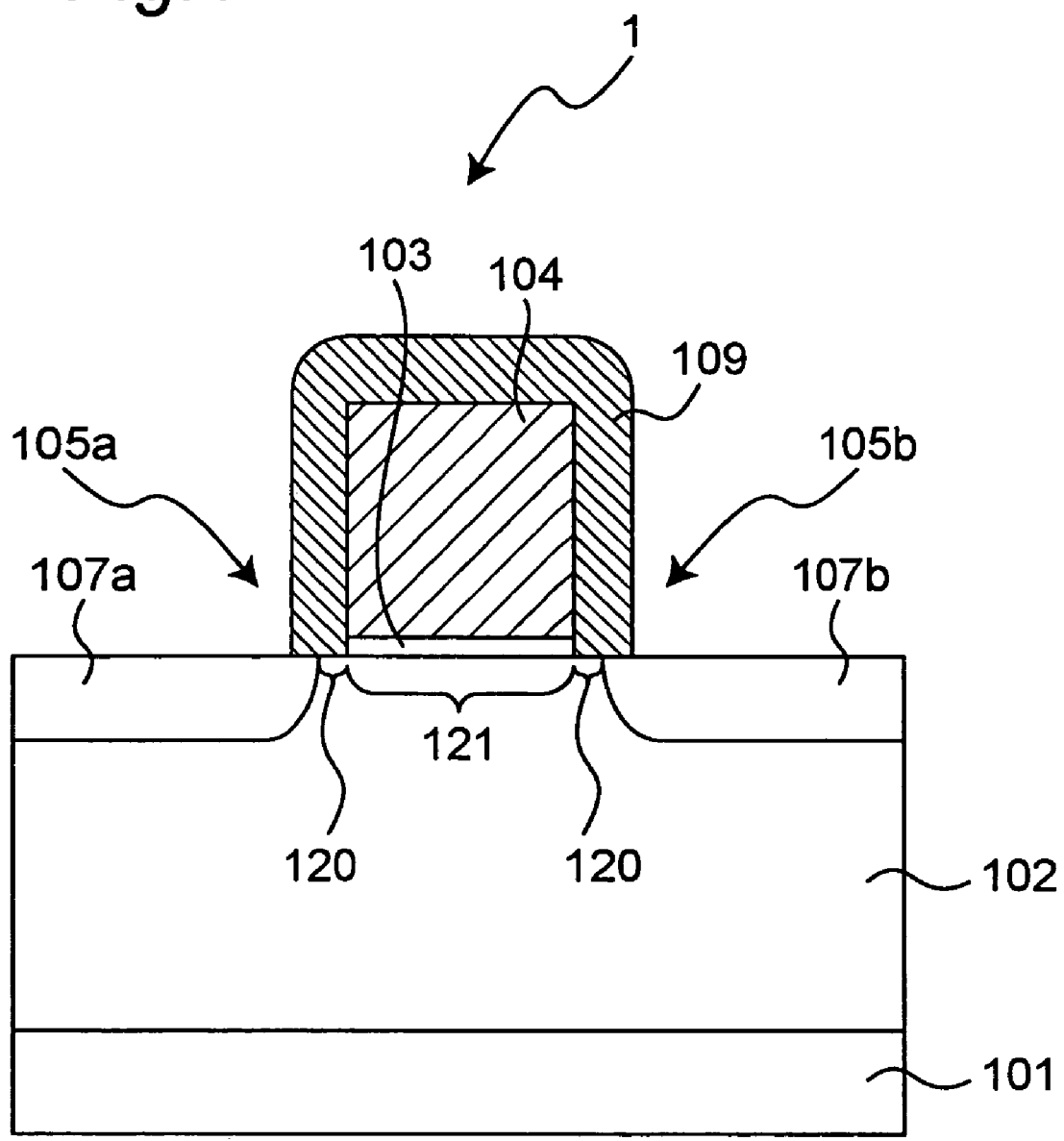
FIG. 1 is a schematic sectional view of an essential part of a memory element in a semiconductor storage device of a first embodiment of the present invention.

An outline of a memory element to be employed in the semiconductor storage device of the present invention will be described first.

The memory element employed in the semiconductor storage device of the present invention is constructed mainly of first conductivity type regions that are diffusion regions, a second conductivity type region, charge storage regions each straddling the border between the first and second conductivity type regions, and a gate electrode (or word line) on a gate insulation film, or mainly of a semiconductor layer, a gate insulation film, a gate electrode (or word line) on the gate insulation film, memory function bodies on both sides of the gate electrode (or word line), a channel region, and diffusion regions on both sides of the channel region. Herein, the channel region generally means a region which is, generally, of the same conductive type as that of the semiconductor layer and is located right under the gate electrode (or word line), while the diffusion region means a region of a conductive type opposite to that of the channel region.

The memory element functions as a memory device storing four-valued or more information by storing binary or more information in one charge retention film. The memory element also functions as a memory cell having a selector transistor function and a memory transistor function because of the variable resistance effect of the memory function body. However, the memory element does not necessarily need to store four-valued or more information, but it may also function to store, for example, binary information.

It is preferable that the semiconductor storage device of the present invention is formed on a semiconductor substrate as the semiconductor layer, preferably in a first conductivity type well region formed in the semiconductor substrate.

The semiconductor substrate is not limited to particular ones as far as it is applicable to semiconductor apparatuses, and it is possible to use various substrates such as bulk substrates made from elemental semiconductors such as silicon and germanium, or compound semiconductors such as SiGe, GaAs, InGaAs, ZnSe, and GaN; SOI (Silicon on Insulator) substrates; SOS (Silicon on Sapphire) substrates, and multilayer SOI substrates, and substrates having a semiconductor layer on a glass or plastic substrate. Among others, a silicon substrate or an SOI substrate having a silicon layer formed as a surface semiconductor layer is preferable. The semiconductor substrate or the semiconductor layer may be monocrystal (e.g., a single crystal obtained by epitaxial growth), polycrystalline, or amorphous, though a current amount flowing inside will be slightly different among them.

In the semiconductor layer, it is preferable that device isolation regions are formed. Elements such as transistors, capacitors and resistors, circuits composed of such elements, semiconductor devices, and an inter-layer insulating film or films may be formed in combination in a single or a multilayer structure on the semiconductor substrate or the semiconductor layer. It is noted that the device isolation regions may be formed by any of various device isolation films including a LOCOS (local oxidation of silicon) film, a trench oxide film, and an STI (Shallow Trench Isolation) film. The semiconductor layer may be either of a P type or an N type conductivity type, and it is preferable that at least one first conductivity type (P type or N type) well region is formed in the semiconductor substrate. Acceptable impurity concentrations of the semiconductor layer and the well region are those within the range known in the art. It is noted that in the case of using an SOI substrate as the semiconductor layer, a well region may be formed in the surface semiconductor layer, and also a body region may be provided under the channel region.

Materials of the gate insulating film or the insulation film are not particularly limited as far as they are usable in typical semiconductor apparatuses. For example, insulating films including a silicon oxide film and a silicon nitride film, and high-dielectric films including aluminum oxide films, titanium oxide films, tantalum oxide films, hafnium oxide films are usable in the form of a single-layer film or a multi-layer film. Among others, the silicon oxide film is preferable. An appropriate thickness of the gate insulating film is, for example, approx. 1 to 20 nm, preferably 1 to 6 nm. The gate insulating film may be only formed right under the gate electrode, or may be formed to be larger (in width) than the gate electrode.

The gate electrode or word line is formed on the gate insulation film normally in a shape for use in a semiconductor device or a shape that has a concave portion in a lower end portion. Herein, the "single gate electrode" is defined as a gate electrode consisting of a monolayer or multilayer conductive film and formed into a single inseparable piece. The gate electrode may have a side wall insulation film on each side surface. The gate electrode is normally not specifically limited so long as it is used for a semiconductor device, and there can be enumerated conductive films of: polysilicon; metals including copper and aluminum; high-melting metals including tungsten, titanium, and tantalum; and silicides of high-melting metals, in the form of a single-layer or a multi-layer. The gate electrode should properly be formed with a film thickness of, for example, about 50 to 400 nm. It is to be noted that a channel region is formed under the gate electrode.

The memory function body has at least a function to retain electric charges (hereinafter referred to as a "charge retention function"). In other words, the memory function body includes a film or region that has a function to store and retain charges, trap charges or retain a charge polarized state. Materials implementing these functions include: silicon nitride; silicon; silicate glass including impurities such as phosphorus or boron; silicon carbide; alumina; high-dielectric substances such as hafnium oxide, zirconium oxide, or tantalum oxide; zinc oxide; and metals. The memory function body may be formed into single-layer or multi-layer structure of: for example, an insulating film containing a silicon nitride film; an insulating film incorporating a conductive film or a semiconductor layer inside; and an insulating film containing one or more conductor dots or semiconductor dots. Among these, the silicon nitride is preferable because it can achieve a large hysteresis property by the presence of a number of levels for trapping electric charges, and has good holding characteristics in that the electric-charge holding time is long and that there hardly occurs leakage of electric charges caused by generation of leakage paths, and further because it is a material normally used in LSI process.

Use of an insulating film containing inside an insulating film having a charge holding function such as a silicon nitride film enables increase of reliability relating to memory holding. Since the silicon nitride film is an insulator, electric charges of the entire silicon nitride film will not be immediately lost even if part of the electric charges are leaked. Further, in the case of arraying a plurality of memory elements, even if the distance between the memory elements is shortened and adjacent memory function bodies come into contact with each other, information stored in each memory function body is not lost unlike the case where the memory function body is made from a conductor. Also, it becomes possible to dispose a contact plug closer to the memory function body, or in some cases it becomes possible to dispose the contact plug so as to overlap with the memory function body, which facilitates miniaturization of the memory elements.

For further increase of the reliability relating to the memory holding, the insulator having a function of holding electric charges is not necessarily needed to be in the film shape, and insulators having the function of holding an electric charge may preferably be present in an insulating film in a discrete manner. More specifically, such insulators may be dispersed like dots within a material having difficulty in holding electric charges, such as silicon oxide.

Also, use of an insulator film containing inside a conductive film or a semiconductor layer as a charge holding portion enables free control of the quantity of electric charges injected into the conductor or the semiconductor, thereby bringing about an effect of facilitating achieving a multi-valued memory cell.

Further, using an insulator film containing one or more conductor or semiconductor dots as a memory function body facilitates execution of write and erase by direct tunneling of electric charges, thereby bringing about an effect of reduced power consumption.

Moreover, it is acceptable to use, as a memory function body, a ferroelectric film such as PZT (lead zirconate titanate) and PLZT (lead lanthanum zirconate titanate) whose polarization direction is changed by an electric field. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase is achievable.

It is preferable that the memory function body further contains a region that obstructs escape of electric charges or a film having a function of obstructing escape of electric charges. Materials fulfilling the function of obstructing escape of electric charges include a silicon oxide.

Preferably, the charge retention film contained in the memory function body is formed on both sides of the gate electrode directly or through an insulating film, and it is disposed on the semiconductor substrate (a well region, a body region, or a source/drain region or a diffusion layer region) through the gate insulating film or the insulating film. The charge retention films on both sides of the gate electrode are preferably formed so as to cover all or part of side surfaces of the gate electrode directly or through the insulating film. In an application where the gate electrode has a recess portion on the lower edge side, the charge retention film may be formed so as to fill the entire recess portion or part of the recess portion directly or through the insulating film.

Preferably, the gate electrode is formed only on the side surface of the memory function body, or the upper portion of the charge holding portion is not covered with the gate electrode. In such arrangement, it becomes possible to dispose a contact plug closer to the gate electrode, which facilitates miniaturization of the memory elements. Also, the memory elements having such simple disposition are easily manufactured, resulting in an increased yield.

If a conductive film or a semiconductor film is used as a charge retaining film, it is preferable to place such a film via an insulation film such that the charge retaining film does not touch the conductive film (semiconductor substrate, well region, body region, source/drain region, or diffusion region) or the gate electrode. For example, there may be a stacked structure of a conductive film and an insulation film, a structure in which dots of a conductive film is scattered in an insulation film, a structure in which the conductive or semiconductor charge retention film is included in a side wall insulation film on a side surface of the gate, etc.

The diffusion region can be made to function as a source/drain region and has a conductivity type opposite to that of the semiconductor layer or the well region. A junction of the diffusion region and the semiconductor layer or the well region should preferably have a steep slope of impurity concentration. The reason for the above is that hot electrons and hot holes are efficiently generated at a low voltage, and high-speed operation can be achieved at a lower voltage. The junction depth of the diffusion region is not specifically limited and is allowed to be properly adjusted according to the performance and so on of the semiconductor storage device desired to be obtained. When a SOI substrate is employed as a semiconductor substrate, the diffusion region may have a junction depth smaller than the film thickness of the surface semiconductor layer. However, the diffusion region should preferably have a junction depth almost equal to the film thickness of the surface semiconductor layer.

The diffusion region may be arranged so as to overlap with the gate electrode end or arranged so as to meet the gate electrode end or arranged so as to be offset with respect to the gate electrode end. In particular, in the case of offset, the easiness of inversion of the offset region under the charge retaining film is largely changed by the quantity of charges accumulated in the memory function body when the voltage is applied to the gate electrode, increasing the memory effect and reducing the short-channel effect. Therefore, this arrangement is preferable. However, since a drive current between the diffusion regions (source and drain) is significantly reduced if the offset is excessive, it is preferred that the amount of offset, i.e., a distance from one gate electrode end to the nearer diffusion region in the direction of the gate length should preferably be shorter than the thickness of the charge retaining film in the direction parallel to the gate length direction. What is particularly important is that at least part of the film or region having the charge retention function in the memory function body overlaps with part of the diffusion region. The reason for the above is that the essence of the memory elements that constitute the semiconductor storage device of the present invention is to rewrite the storage by the electric field intersecting the memory function body due to a voltage difference between the gate electrode and the diffusion region existing only in the side wall portion of the memory function body.

Of the two diffusion regions, only one diffusion region may be offset from the corresponding gate end. However, it is preferable that both the diffusion regions are offset.

If both of the diffusion regions are offset, it is possible for one memory element to store 2-bit information. Also, because both of the diffusion regions are offset, it is possible to suppress the short channel effect much more effectively than when only one diffusion region is offset. Furthermore, a process, which would be required when only one diffusion region is offset, is eliminated, which in turn dispenses with a margin required when the above process is added. As is apparent from the above, because the diffusion regions are both offset, the memory elements and memory cell array are easy to miniaturize, so that higher integration is achievable. Also, the production cost can be reduced.

The diffusion region may be partially extended to a position higher than the surface of the channel region, i.e., the lower surface of the gate insulation film. In this case, it is proper that a conductive film integrated with this diffusion region is constructed while being laminated on the diffusion region formed in the semiconductor substrate. As the conductive film, there can be enumerated, for example, semiconductor of polysilicon, amorphous silicon or the like, silicide, aforementioned metals, high-melting-point metals and so on. Among others, polysilicon is preferable. The reason for the above is that the polysilicon, of which the impurity diffusion speed is significantly greater than that of the semiconductor layer, easily tolerates a shallowed junction depth of the diffusion region in the semiconductor layer and easily suppresses the short-channel effect. In this case, it is preferable to provide an arrangement that part of this diffusion region and the gate electrode hold at least part of the memory function body therebetween.

The memory element of the present invention can be formed by the ordinary semiconductor process according to a method similar to the method of forming a side wall spacer of a single layer or laminate structure on the side wall of the gate electrode or word line. In concrete, there can be enumerated: a method comprising forming a gate electrode or a word line, thereafter forming a single layer film or multilayer film including a charge retaining film, such as a charge retaining film, a charge retaining film/insulation film, an insulation film/charge retaining film, and an insulation film/charge retaining film/insulation film, and leaving the film or films in a side wall spacer shape by etching back under appropriate conditions; a method comprising forming an insulation film or a charge retaining film, leaving the film in a side wall spacer shape by etching back under appropriate conditions, further forming a charge retaining film or insulation film and leaving the film in a side wall spacer shape by etching back under appropriate conditions; a method comprising coating or depositing, on a semiconductor wafer including a gate electrode, an insulation film material in which a particulate charge retaining material is distributed, and leaving the insulation film material in a side wall spacer shape by etching back under appropriate conditions; a method comprising forming a gate electrode, thereafter forming the single layer film or the multilayer film and carrying out patterning by using a mask, and so on. Moreover, there can be enumerated a method comprising forming a charge retaining film, a charge retaining film/insulation film, an insulation film/charge retaining film, or an insulation film/charge retaining film/insulation film before forming a gate electrode or an electrode, forming an opening through the film or films in a region that becomes a channel region, forming a gate electrode material film on the entire upper surface of the wafer and patterning this gate electrode material film in a shape, which is larger than the opening in size and encompasses the opening.

One example of the formation process of this memory element will be described.

First, a gate insulation film and a gate electrode are formed on a semiconductor substrate according to a well-known procedure. Subsequently, a silicon oxide film is formed by the thermal oxidation method to a film thickness of 0.8 to 20 nm, or more preferably to a film thickness of 3 to 10 nm or deposited by the CVD (Chemical Vapor Deposition) method on the entire upper surface of the semiconductor substrate. Next, a silicon nitride film is deposited by the CVD method to a film thickness of 2 to 15 nm or more preferably to a film thickness of 3 to 10 nm on the entire upper surface of the silicon oxide film. Further, a silicon oxide film is deposited to a film thickness of 20 to 70 nm on the entire surface of the silicon nitride film by the CVD method.

Subsequently, by etching back the silicon oxide film/silicon nitride film/silicon oxide film by anisotropic etching, a memory function body appropriate for storage is formed in a side wall spacer shape on the side wall of the gate electrode.

Subsequently, by injecting ions using the gate electrodes and the memory function body in the side wall spacer shape used as a mask, a diffusion region (source/drain region) is formed. Subsequently, it is proper to carry out a silicide process or an upper portion wiring process according to a well-known procedure.

When a memory cell array is constructed by arranging the memory elements of the present invention, the best mode of the memory elements is to satisfy, for example, all the required conditions:

(1) The function of a word line is possessed by the integrated body of the gate electrodes of a plurality of memory elements;

(2) Formed on each of opposite sides of the word line is a memory function body that continuously extends along the word line;

(3) A material that retains electric charges in the memory function body is an insulator, and in particular, a silicon nitride film;

(4) The memory function bodies are constructed of an ONO (Oxide Nitride Oxide) film, and the silicon nitride film has a surface roughly parallel to the surface of the gate insulation film;

(5) The silicon nitride film in each memory function body is separated from the word line and the channel region by the silicon oxide film;

(6) A region having a function of retaining charges (e.g., a region formed of silicon nitride film) in each memory function body overlaps with the corresponding diffusion region;

(7) The thickness of the insulation film, which separates the silicon nitride film that has a surface roughly parallel to the surface of the gate insulation film from the channel region or the semiconductor layer differs from the thickness of the gate insulation film;

(8) Write and erase operations of one memory element are executed by a single word line;

(9) There is no electrode (word line), on each memory function body, which has a function to assist the write and erase operations; and

(10) A portion put in contact with the diffusion region right under each memory function body has a region where the impurity concentration of the conductivity type opposite to the conductivity type of the diffusion region is high.

The memory elements are not required to satisfy all of these requirements, but may satisfy at least one of these requirements.

When some of the above requirements are satisfied, there are most preferable combinations of requirements. For example, a most preferable combination resides in that (3) a material that retains electric charges in the memory function body is an insulator, and in particular, a silicon nitride film; (9) there is no electrode (word line), on each memory function body, which has a function to assist the write and erase operations; and (6) a region having a function of retaining charges (e.g., a region formed of silicon nitride film) in each memory function body overlaps with the corresponding diffusion region.

When the requirement (3) and the requirement (9) are satisfied, the following great advantages are obtained. First, a bit line contact can be arranged closer to the memory function body located on the word line side wall, or even if the memory elements are put close to each other in distance, the plurality of memory function bodies do not interfere with one another, and the storage information can be retained. Therefore, the miniaturization of the memory elements is facilitated. When the charge retaining region in the memory function body consists of a conductor, interference occurs between the adjacent charge retaining regions by capacitive coupling as the distance between the memory elements is reduced, and the storage information cannot be retained.

Moreover, when the charge retaining region in the memory function body consists of an insulator (e.g., silicon nitride film), there is no need to make the memory function bodies of one memory cell independent of those of another memory cell. For example, the memory function bodies continuously formed on both sides of and along one word line shared by a plurality of memory cells are not required to be isolated every memory cell, and it is possible to share the memory function bodies formed on both sides of one word line by a plurality of memory cells that share the word line. Therefore, the photolithography and etching process for isolating the memory function bodies become unnecessary, and the manufacturing process is simplified. Furthermore, the alignment margin for the photolithography process and the film etching margin become unnecessary. Therefore, the margin between the memory cells can be reduced. Therefore, in comparison with the case where the charge retaining region in the memory function body consists of a conductor (e.g., polycrystalline silicon film), the memory cell occupation area can be miniaturized even if the same microfabrication level is applied. The case where the charge retaining region in the memory function body consists of a conductor would need the photolithography and etching process for separating the memory function bodies every memory cell, the photolithography alignment margin and the film etching margin.

Furthermore, since the element structure is simple in that no electrode having the function to assist the write (program) and erase operations is located on the memory function bodies, the number of fabrication process steps is reduced, and the yield can be improved. Therefore, combination with the transistors that constitute a logic circuit and an analog circuit can be facilitated.

Furthermore, we have found that as a very important design matter, if the requirements (3) and (9) are satisfied and if the requirement (6) is also satisfied, the write (program) and erase operations can be executed at a very low voltage. In concrete, we have ascertained that the write and erase operations can be executed at a low voltage of not higher than 5 V. This operation produces a very large effect in terms of circuit design. There is no need to make a high voltage in a chip dissimilarly from the flash memory, and therefore, a charge pump circuit, which requires an enormous occupation area, can be eliminated or reduced in scale. Particularly, when a small-scale capacity memory for adjustment is built in a logic LSI, the occupation area of the memory section is dominated by the occupation area of the peripheral circuit for driving the memory cells than the memory cells. Therefore, it is most effective to eliminate or reduce the scale of the memory cell voltage booster circuit in order to reduce the chip size.

This is why satisfying the requirements (3), (9) and (6) is particularly preferable.

On the other hand, when the requirement (3) is not satisfied or when electric charges are retained by a conductor in the memory function body, the write (program) operation can be executed even when the requirement (6) is not satisfied, or when the conductor in the memory function body and the diffusion region do not overlap with each other. This is because the conductor in the memory function body executes write assist by capacitive coupling with the gate electrode (write electrode).

Moreover, when the requirement (9) is not satisfied, or when there is an electrode that has the function to assist the write and erase operations on the memory function body, the write operation can be executed even when the requirement (6) is not satisfied, or when the insulator in the memory function body and the diffusion region do not overlap with each other.

In an memory cell array wherein a plurality of memory elements are arrayed, preferably two memory function bodies each consisting of one or more insulation materials may be formed on the opposite sides of a single word line, respectively so that the word line and the memory function bodies on both sides of the word line are shared by a plurality of memory elements. The definition of the term "single word line" is as described before.

The above arrangement substantially satisfies the requirements (3), (9) and (6). Thus, even in the memory cell array having the memory elements arrayed, the aforementioned effects and advantages are obtained. Further, because only a single word line is selected in rewriting the memory elements on the sides of the single word line, the number of word lines required for the memory operation becomes minimum, so that the memory cell array is integrated at a higher packing density.

By being combined with a logic element, a logic circuit or the like, the semiconductor storage device of the present invention can be effectively widely applied to data processing systems of personal computers, notebook type computers, laptop type computers, personal assistant/transmitters, mini computers, workstations, mainframes, multi-processor computers or any other types of computers; electronic components that constitute a data processing system, such as CPU's, memories and data storage devices; communication equipment such as telephones, PHS's (Personal Handy phone Systems), modems and routers; image display equipment such as display panels and projectors; business machines such as printers, scanners and copiers; imaging equipment such as video cameras and digital cameras; amusement equipment such as game machines and music players; information equipment of portable information terminals, watches and electronic dictionaries; car equipment such as car navigation systems and car audio devices; AV (Audio Visual) equipment for recording and reproducing information of animations, still pictures and music; electrical appliances such as washing machines, microwave ovens, refrigerators, rice cookers, dish washers, vacuum cleaners and air conditioners; healthcare equipment such as massage machines, scales and sphygmomanometers; and electronic equipment such as portable storage devices of IC cards, memory cards and so on. In particular, the applications to the portable electronic equipment of portable telephones, portable information terminals, IC cards, memory cards, portable computers, portable game machines, digital cameras, portable animation players, portable music players, electronic dictionaries and watches are effective. It is to be noted that the semiconductor storage device of the present invention may be built in electronic equipment as at least part of a control circuit or a data storage circuit, or detachably mounted thereto at need.

Embodiments of the semiconductor storage device and the portable electronic equipment of the present invention will be described in detail below with reference to the drawings.

First Embodiment

The semiconductor storage device of this embodiment is provided with a memory element 1 that serves as one example of the nonvolatile memory element as shown in FIG. 1.

In the memory element 1, a gate electrode 104 is formed on a P-type well region 102 formed via a gate insulation film 103 on the surface of a semiconductor substrate 101. A silicon nitride film 109, which has a trap level for retaining electric charges and serves as a charge retaining film, is arranged on the upper surface and the side surfaces of the gate electrode 104, and the portions of the silicon nitride film 109 located on both side walls of the gate electrode 104 serve as memory function bodies 105a and 105b for actually retaining electric charges. N-type diffusion regions 107a and 107b, which function as a source region and a drain region, respectively, are formed on both sides of the gate electrode 104 and inside the P-type well region 102. The diffusion regions 107a and 107b have an offset structure. That is, the diffusion regions 107a and 107b do not reach the region 121 located under the gate electrode, and the offset regions 120 under the charge retaining film (silicon nitride film 109) constitute part of the channel region.

Figure 2A:
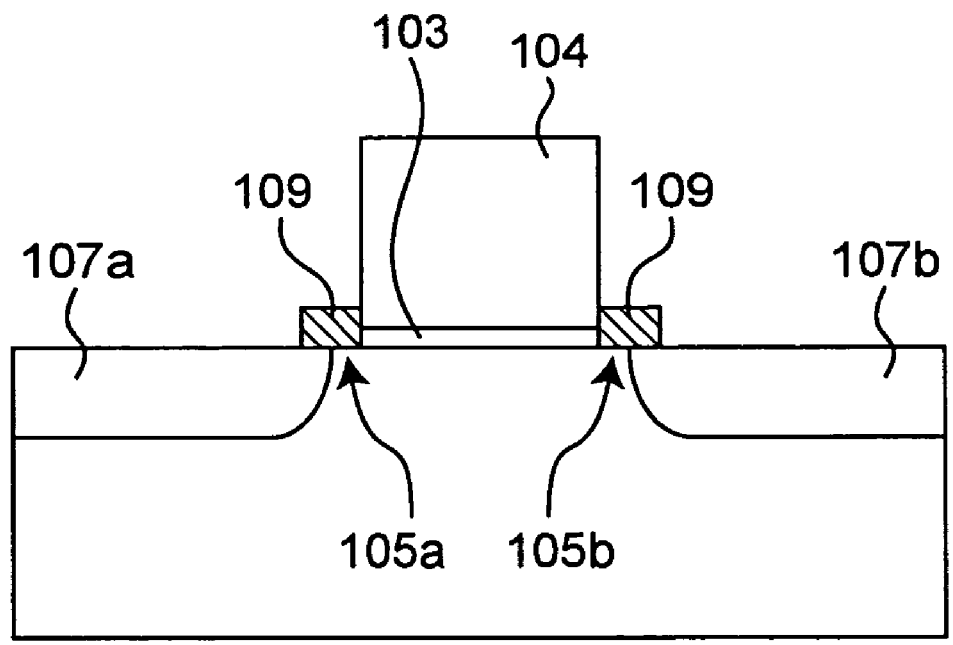
FIG. 2A is a schematic sectional view of an essential part of a modification of the memory element in the semiconductor storage device of the first embodiment.
Figure 2B:
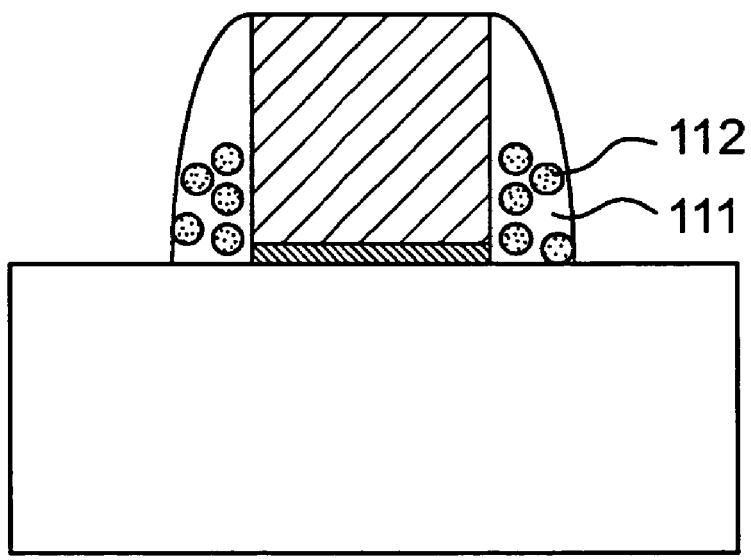
FIG. 2B is a schematic sectional view of an essential part of a modification of the memory element in the semiconductor storage device of the first embodiment.

It is to be noted that the memory function bodies 105a and 105b, which substantially retain electric charges, are both sides wall portions of the gate electrode 104. Therefore, the silicon nitride film 109 is only required to be formed in the regions corresponding to these portions (see FIG. 2A). Moreover, the memory function bodies 105a and 105b may have a structure in which particles 112 constructed of a conductor or a semiconductor of a nanometer size are distributed in scattered dots in an insulation film 111 (see FIG. 2B). In this case, it is difficult for an electric charge to tunnel its way through the dots since the quantum effect is excessive when the particle 112 has a size smaller than 1 nm, and no remarkable quantum effect appears at the room temperature when the size exceeds 10 nm. Therefore, the diameter of the particle 112 should preferably be within a range of 1 nm to 10 nm. Furthermore, the silicon nitride films 109, which become charge retaining films, may be formed in a side wall spacer shape on the side surfaces of the gate electrode (see FIG. 3).

The principle of write operation of the memory element will be described with reference to FIG. 3 and FIG. 4. In this case, the description is based on the case where the entire bodies of the memory function bodies 131a and 131b have a function to retain electric charges. Moreover, the term of "write" means the injection of electrons into the memory function bodies 131a and 131b when the memory element is the N-channel type. Hereinafter, the description is provided on the assumption that the memory element is the N-channel type.

Figure 3:
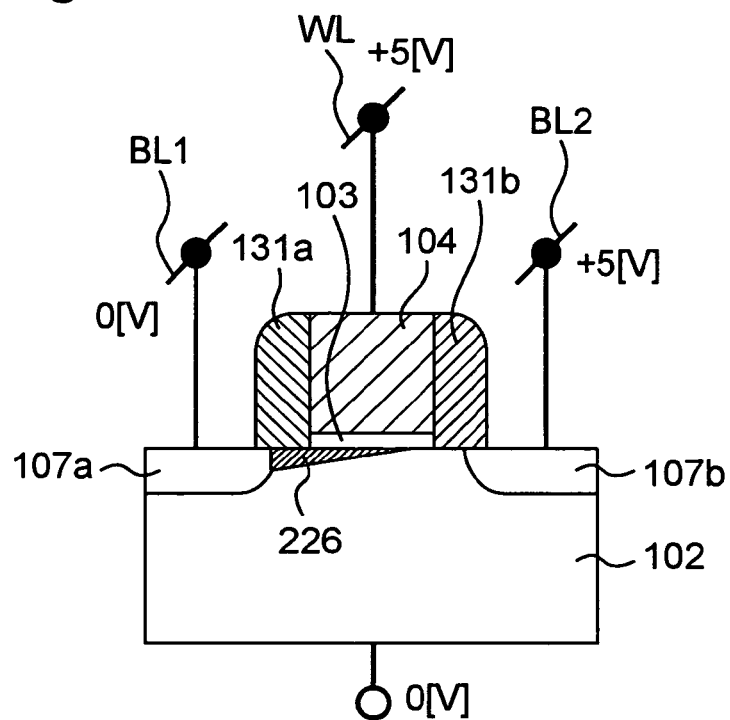
FIG. 3 is a view for explaining the write operation of the memory element in the semiconductor storage device of the first embodiment.

In order to inject an electron (execute write) into the second memory function body 131b, as shown in FIG. 3, an N-type first diffusion region 107a and an N-type second diffusion region 107b are made to serve as a source electrode and a drain electrode, respectively. For example, a voltage of 0 V is applied to the first diffusion region 107a and the P-type well region 102, a voltage of +5 V is applied to the second diffusion region 107b, and a voltage of +5 V is applied to the gate electrode 104. According to the above-mentioned voltage conditions, an inversion layer 226 extends from the first diffusion region 107a (source electrode), but it does not reach the second diffusion region 107b (drain electrode), generating a pinch-off point. An electron is accelerated from the pinch-off point to the second diffusion region 107b (drain electrode) by a high electrical field and becomes a so-called hot electron (high energy conduction electron). Write is executed by the injection of this hot electron into the second memory function body 131b. Since no hot electron is generated in the vicinity of the first memory function body 131a, write is not executed.

Figure 4:
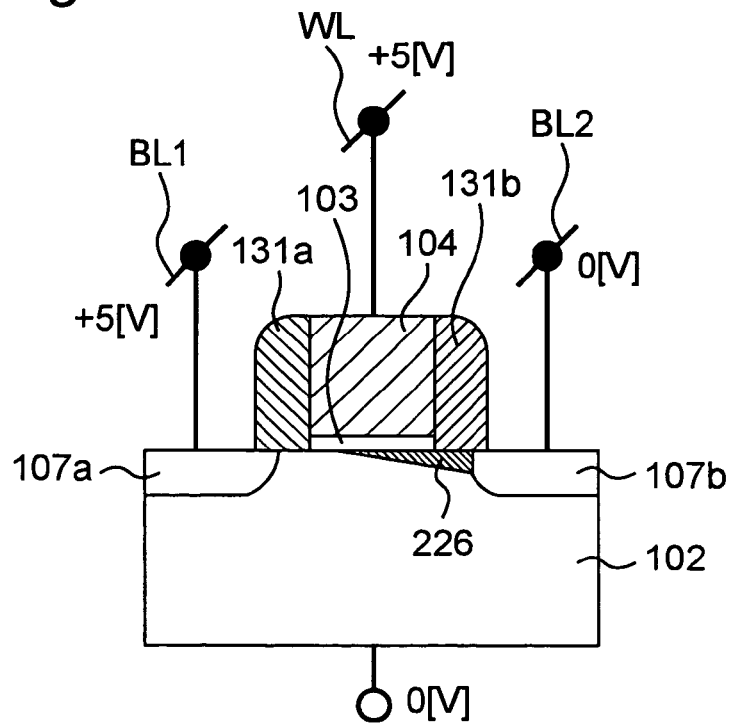
FIG. 4 is a view for explaining the write operation of the memory element in the semiconductor storage device of the first embodiment.

On the other hand, in order to inject an electron (execute write) into the first memory function body 131a, as shown in FIG. 4, the second diffusion region 107b and the first diffusion region 107a are made to serve as the source electrode and the drain electrode, respectively. For example, a voltage of 0 V is applied to the second diffusion region 107b and the P-type well region 102, a voltage of +5 V is applied to the first diffusion region 107a, and a voltage of +5 V is applied to the gate electrode 104. As described above, by exchanging the source and drain regions reversely to the case where an electron is injected into the second memory function body 131b, write can be executed by injecting an electron into the first memory function body 131a.

Next, the principle of erase operation of the memory element will be described with reference to FIG. 5 and FIG. 6.

Figure 5:
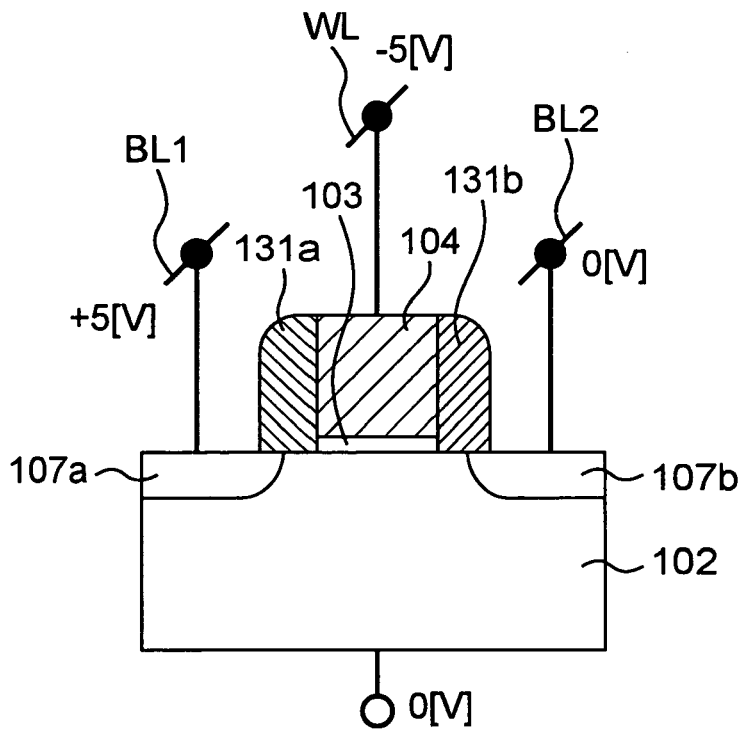
FIG. 5 is a view for explaining the erase operation of the memory element in the semiconductor storage device of the first embodiment.

According to a first method for erasing the information stored in the first memory function body 131a, as shown in FIG. 5, a positive voltage (e.g., +5 V) is applied to the first diffusion region 107a, a voltage of 0 V is applied to the P-type well region 102, a reverse bias is applied to a PN junction of the first diffusion region 107a and the P-type well region 102, and a negative voltage (e.g., −5 V) is further applied to the gate electrode 104. At this time, the potential slope becomes steep, in particular, in the vicinity of the gate electrode 104 at the PN junction due to the influence of the gate electrode to which the negative voltage is applied. Accordingly, a hot hole (high energy hole) is generated on the P-type well region 102 side of the PN junction due to band-to-band tunneling. This hot hole is drawn toward the gate electrode 104 that has a negative potential, and consequently, the hole is injected into the first memory function body 131a. As described above, the erase of the first memory function body 131a is executed. In this case, it is proper to apply a voltage of 0 V to the second diffusion region 107b.

When erasing the information stored in the second memory function body 131b, it is proper to exchange the potential of the first diffusion region with the potential of the second diffusion region in the aforementioned case.

Figure 6:
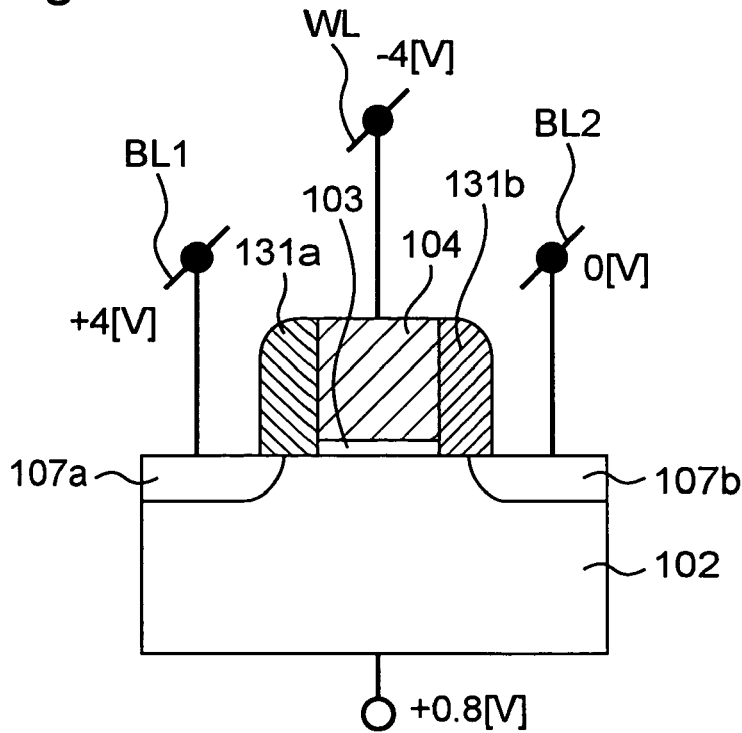
FIG. 6 is a view for explaining the erase operation of the memory element in the semiconductor storage device of the first embodiment.

According to a second method for erasing the information stored in the first memory function body 131a, as shown in FIG. 6, a positive voltage (e.g., +4 V) is applied to the first diffusion region 107a, a voltage of 0 V is applied to the second diffusion region 107b, a negative voltage (e.g., −4 V) is applied to the gate electrode 104, and a positive voltage (e.g., +0.8 V) is applied to the P-type well region 102. In this case, a forward voltage is applied across the P-type well region 102 and the second diffusion region 107b, injecting an electron into the P-type well region 102. The injected electron diffuses to a PN junction of the P-type well region 102 and the first diffusion region 107a and become hot electrons by being accelerated there by an intense electric field. This hot electron generates an electron-hole pair at the PN junction. That is, by applying the forward voltage across the P-type well region 102 and the second diffusion region 107b, the electron injected into the P-type well region 102 becomes a trigger to generate a hot hole at the PN junction located on the opposite side. The hot hole generated at the PN junction is drawn toward the gate electrode 104 that has a negative potential, and consequently, the hole is injected into the first memory function body 131a.

According to this method, even when only a voltage insufficient for the generation of a hot hole by band-to-band tunneling is applied to the PN junction of the P-type well region and the first diffusion region 107a, the electron injected from the second diffusion region 107b becomes a trigger to generate an electron-hole pair at the PN junction, allowing a hot hole to be generated. Therefore, the voltage during the erase operation can be lowered. Particularly, when an offset region 120 (see FIG. 1) exists, the effect that the PN junction becomes steep due to the gate electrode to which the negative potential is applied is a little, and therefore, it is difficult to generate a hot hole by band-to-band tunneling. The second method makes up for the defect, and the erase operation can be achieved at a low voltage.

In erasing the information stored in the first memory function body 131a, a voltage of +5 V must to be applied to the first diffusion region 107a according to the first erase method, whereas a voltage of +4 V is sufficient according to the second erase method. As described above, according to the second method, the voltage during erase can be reduced. Therefore, power consumption is reduced, and the deterioration of the memory element due to the hot carrier can be restrained.

Moreover, by either one of the erase methods, overerase does not easily occur in the memory element. The term of "overerase" here is a phenomenon that the threshold value is lowered without saturation as the amount of holes accumulated in the memory function body increases. This is a serious problem in EEPROM (Electrically Erasable Programmable Read-Only Memory) represented by a flash memory, and there occurs a fatal malfunction that memory cell selection becomes impossible particularly when the threshold value becomes negative. On the other hand, in the memory element of the semiconductor storage device of the present invention, only electrons are induced under the memory function bodies even when a large amount of holes are accumulated in the memory function body, and almost no influence is exerted on the potential of the channel region under the gate insulation film. The threshold value during erase is determined by the potential under the gate insulation film, and therefore, overerase does not easily occur.

Figure 7:
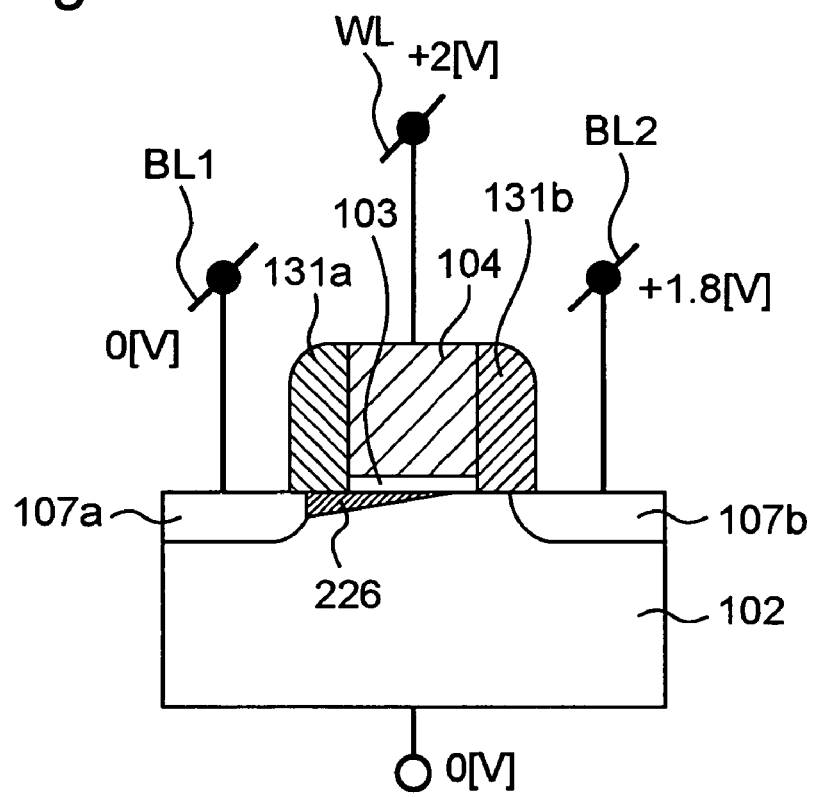
FIG. 7 is a view for explaining the read operation of the memory element of the semiconductor storage device of the first embodiment.

The principle of read operation of the memory element will be further described with reference to FIG. 7.

In reading the information stored in the first memory function body 131a, the transistor is operated by making the first diffusion region 107a and the second diffusion region 107b serve as a source electrode and a drain electrode, respectively. For example, a voltage of 0 V is applied to the first diffusion region 107a and the P-type well region 102, a voltage of +1.8 V is applied to the second diffusion region 107b, and a voltage of +2 V is applied to the gate electrode 104. In this case, when no electron is accumulated in the first memory function body 131a, a drain current easily flows. When electrons are accumulated in the first memory function body 131a, the inversion layer is not easily formed in the vicinity of the first memory function body 131a, and therefore, a drain current hardly flows. Therefore, by detecting the drain current, the storage information of the first memory function body 131a can be read. In particular, when read is executed by giving a voltage that causes the pinch-off operation, the state of charges accumulated in the first memory function body 131a can be more accurately determined without being influenced by the presence or absence of charges in the memory function body 131b.

In reading the information stored in the second memory function body 131b, the transistor is operated by making the second diffusion region 107b and the first diffusion region 107a serve as the source electrode and the drain electrode, respectively. Although not shown, it is proper to apply, for example, a voltage of 0 V to the second diffusion region 107b and the P-type well region 102, apply a voltage of +1.8 V to the first diffusion region 107a and apply a voltage of +2 V to the gate electrode 104. As described above, by exchanging the source and drain regions reversely to the case where the information stored in the first memory function body 131a is read, the information stored in the second memory function body 131b can be read.

If the channel region (offset regions 120) that is not covered with the gate electrode 104 is left, then the inversion layer is lost or formed depending on the presence or absence of surplus electric charges of the memory function bodies 131a and 131b in the channel region that is not covered with the gate electrode 104, and consequently, a great hysteresis (a change in the threshold value) is obtained. It is to be noted that the drain current is largely reduced when the width of the offset region 120 is excessively large, and the read speed is significantly slowed. Therefore, it is preferable to determine the width of the offset region 120 so that sufficient hysteresis and read speed can be obtained.

Even when the diffusion regions 107a and 107b reached the ends of the gate electrode 104, i.e., even when the diffusion regions 107a and 107b and the gate electrode 104 overlapped with each other, the threshold value of the transistor was scarcely changed by the write operation. However, a parasitic resistance at the ends of the source and drain is largely changed, and the drain current is largely reduced (by an order of magnitude or more). Therefore, read can be executed by detecting the drain current, and a function as a memory can be obtained. However, when a larger memory hysteresis effect is needed, it is preferred that the diffusion regions 107a and 107b do not overlap with the gate electrode 104 (the offset region 120 exists).

By the aforementioned operation method, 2-bit write and erase per transistor can be selectively achieved. Moreover, by arranging memory elements with a word line WL connected to the gate electrodes 104 of the memory elements and with a first bit line BL1 and a second bit line BL2 connected to the first diffusion regions 107a and the second diffusion regions 107b, respectively, a memory cell array can be constructed.

Moreover, according to the aforementioned operation method, the 2-bit write and erase per transistor are executed by exchanging the source electrode with the drain electrode. However, the device may be operated as a 1-bit memory by fixing the source electrode and the drain electrode. In this case, it is possible to make one of the source and drain regions have a common fixed voltage, and the number of bit lines connected to the source and drain regions can be reduced by half.

As is apparent from the above description, in the memory element of the semiconductor storage device of the present invention, the memory function bodies are formed independently of the gate insulation film and formed on both sides of the gate electrode, and therefore, the 2-bit operation can be achieved. Moreover, the memory function bodies are separated by the gate electrode, and therefore, interference during rewrite is effectively restrained. Furthermore, the gate insulation film, which is separated from the memory function body, can therefore restrain the short-channel effect by being reduced in film thickness. Therefore, the miniaturization of the memory element and also the semiconductor storage device is facilitated.

Moreover, in the drawings, the same reference numerals are given to the portions where the same material and substances are used and do not necessarily indicate the same shapes.

Moreover, it is to be noted that the drawings are schematic, and the dimensional relations between thickness and plane, ratios of thickness and size between layers and portions and so on are different from those of the actual ones. Therefore, the concrete dimensions of thickness and size should be determined in consideration of the following description. Moreover, there are, of course, included the portions whose mutual dimensional relations and ratios are different between the figures.

Moreover, the thickness and the size of the layers and portions described in the present patent specification are the dimensions of the final shapes in the stage in which the formation of the semiconductor device is completed unless specifically described. Therefore, it is to be noted that the dimensions of the final shapes somewhat change depending on the thermal history and so on of the subsequent processes in comparison with the dimensions immediately after the formation of the films, the impurity regions and so on.

Second Embodiment

Figure 8:
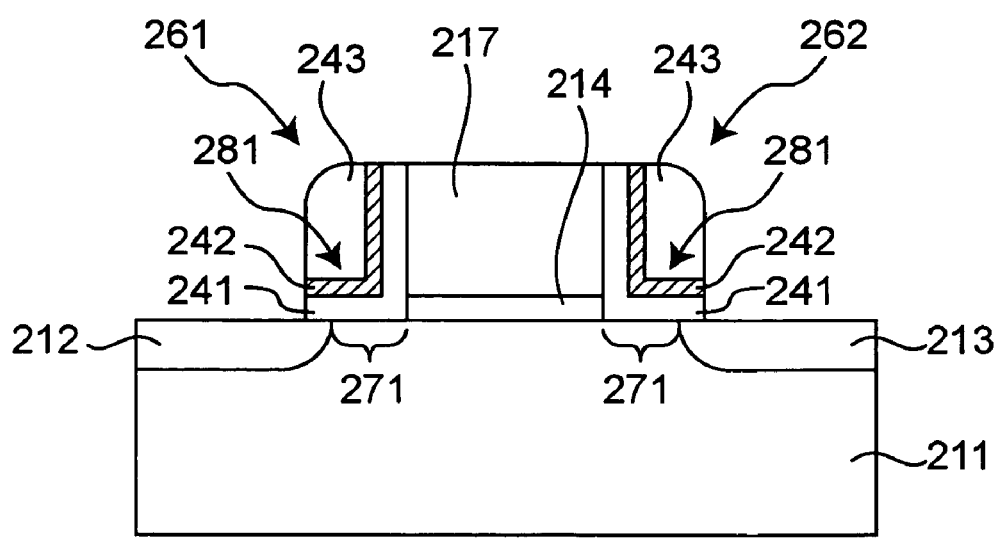
FIG. 8 is a schematic sectional view of an essential part of a memory element in a semiconductor storage device of a second embodiment of the present invention.

As shown in FIG. 8, the memory element in the semiconductor storage device of the present embodiment has a construction substantially similar to that of the memory element 1 of FIG. 1 except for the memory function bodies 261 and 262 are constructed of a region for retaining electric charges (this may be a region for storing electric charges, or a film having the function to retain electric charges) and a region for restraining the escape of electric charges (this may be a film that has a function to restrain the escape of electric charges).

From the point of view of improving the retention characteristic of the memory, the memory function body should preferably include a charge retaining film having the function to retain electric charges and an insulation film. This embodiment employs a silicon nitride film 242 that has a level for trapping electric charges as a charge retaining film and silicon oxide films 241 and 243 that have the operation of preventing the dissipation of electric charges accumulated in the charge retaining film as an insulation film. By the memory function body that including the charge retaining film and the insulation film, the retention characteristic can be improved by preventing the dissipation of electric charges. Moreover, the volume of the charge retaining film can be moderately reduced in comparison with the case where the memory function body is constructed only of the charge retaining film, and the occurrence of a characteristic change due to the movement of electric charges during the retention of the storage can be restrained by limiting the movement of electric charges in the charge retaining film. Furthermore, with the structure in which the silicon nitride film 242 is held between the silicon oxide films 241 and 243, charge injection efficiency during the rewrite operation is increased, and higher-speed operation becomes possible. In this memory element, the silicon nitride film 242 may be replaced by a ferroelectric substance.

Also, the region (silicon nitride film 242) for holding or retaining electric charges in the memory function bodies 261, 262 are overlapped with the diffusion layer regions 212, 213. Herein, the term "overlap" is used to refer to the state that at least part of the region (silicon nitride film 242) for retaining electric charges is present on at least part of the diffusion layer regions 212, 213. It is noted that there are shown a semiconductor substrate 211, a gate insulating film 214, and an offset region 271 between the gate electrode 217 and the diffusion layer regions 212, 213. Though unshown in the drawing, the uppermost surface of the semiconductor substrate 211 under the gate insulating film 214 is a channel region.

An effect produced by the arrangement that the silicon nitride film 242 serving as the region for retaining electric charges in the memory function bodies 261 and 262 overlap with the diffusion regions 212 and 213 will be described.

Figure 9:
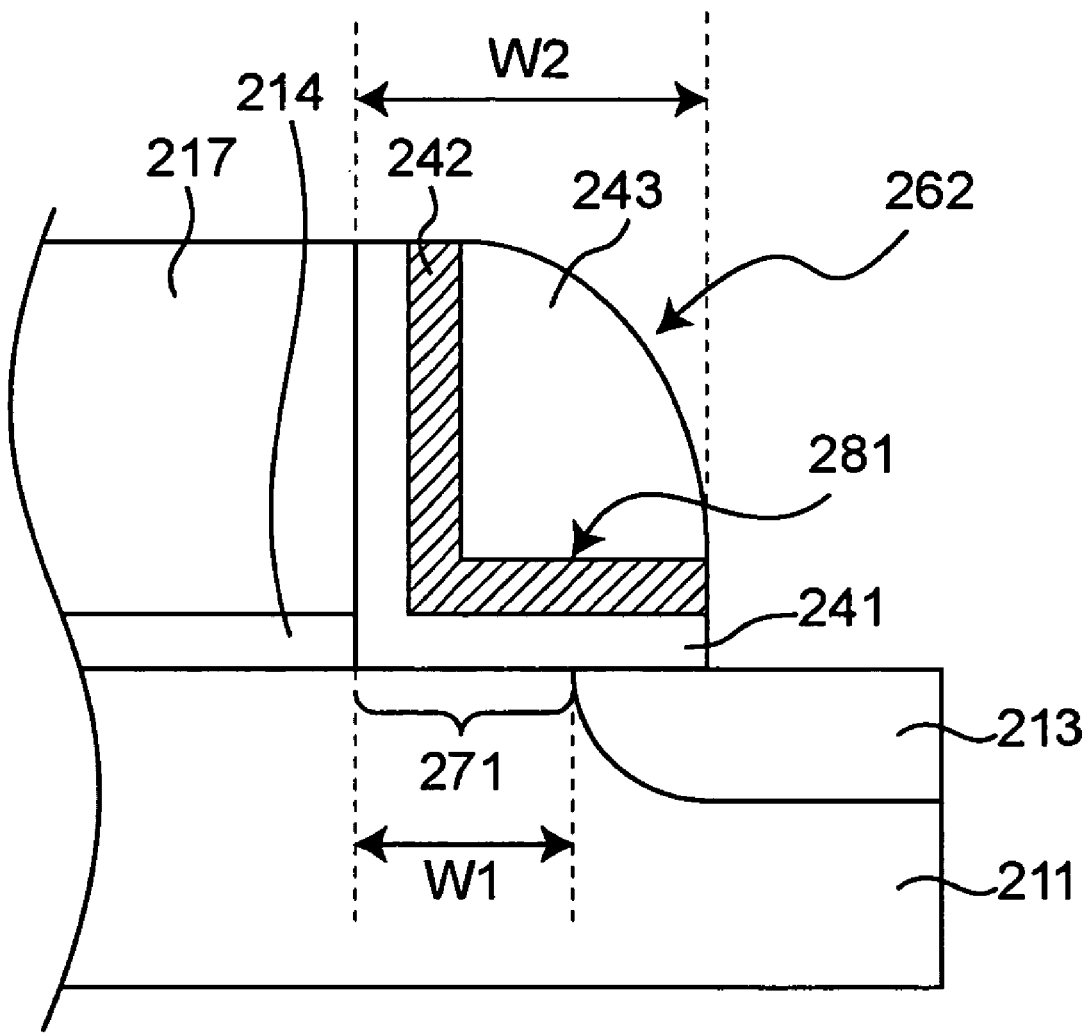
FIG. 9 is an enlarged schematic sectional view of the essential part of the semiconductor storage device of the second embodiment.

As shown in FIG. 9, assuming that the amount of offset of a gate electrode 217 with respect to a diffusion region 213 is W1 and that the width of a memory function body 262 in a cross-sectional plane in the channel-length direction of the gate electrode 217 is W2 in the peripheral portions of the memory function body 262, then the amount of overlap of the memory function body 262 with the diffusion region 213 is expressed by W2−W1. What is important here is that the memory function body 262 constructed of the silicon nitride film 242 of the memory function body 262 overlaps with the diffusion region 213, i.e., the arrangement that the relation: W2>W1 is satisfied.

In FIG. 9, the end of the silicon nitride film 242 remote from the gate electrode 217 coincided with the end of the memory function body 262 remote from the gate electrode 217 at the memory function body 262. Therefore, the width of the memory function body 262 was defined as W2.

Figure 10:
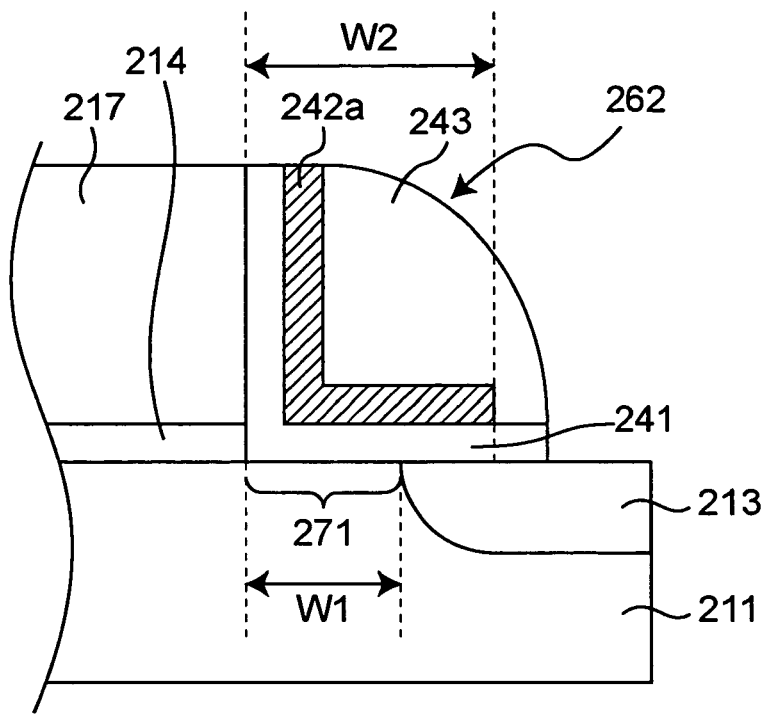
FIG. 10 is an enlarged schematic sectional view of an essential part of a modification of the semiconductor storage device of the second embodiment.

In the case where an edge of a silicon nitride film 242a on the side away from the gate electrode in a memory function body 262a is not aligned with an edge of the memory function body 262a on the side away from the gate electrode as shown in FIG. 10, W2 may be defined as the width from the edge of the gate electrode to the edge of the silicon nitride film 242a on the side away from the gate electrode.

Figure 11:
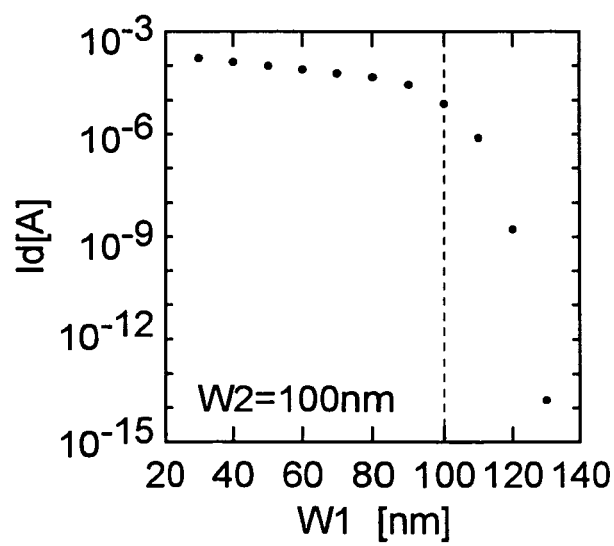
FIG. 11 is a graph showing the electrical characteristic of the memory element in the semiconductor storage device of the second embodiment.

FIG. 11 shows a drain current Id in the structure of FIG. 9 with the width W2 of the memory function body 262 being fixed to 100 nm and the offset amount W1 being varied. Herein, the drain current is obtained by device simulation performed under the conditions that the memory function body 262 is in erase state (positive holes are stored), and the diffusion layer regions 212, 213 are set to be a source electrode and a drain electrode, respectively. As shown in FIG. 11, with W1 being 100 nm or more (i.e., when the silicon nitride film 242 and the diffusion layer region 213 are not overlapped), the drain current shows rapid reduction. Since a drain current value is almost in proportion to a read operation speed, memory performance is rapidly deteriorated when W1 is 100 nm or more. In the range where the silicon nitride film 242 and the diffusion layer region 213 are overlapped, the drain current shows mild reduction. Therefore, taking a manufacturing dispersion into consideration, it is difficult to obtain a memory function unless at least part of the silicon nitride film 242 that is a film having a function of holing electric charges is overlapped with the source/drain region.

Based on the above-described result of the device simulation, a memory cell array is manufactured with W2 being fixed to 100 nm, and W1 being set to 60 nm and 100 nm as design values. When W1 is 60 nm, the silicon nitride film 242 is overlapped with the diffusion layer regions 212, 213 by 40 nm as a design value, and when W1 is 100 nm, there is no overlap as a design value. As a result of measuring read time of these memory cell arrays in comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration to manufacturing dispersion.

It is preferable for reading information stored in the memory function body 261 (region 281) to set the diffusion layer region 212 as a source electrode and the diffusion layer region 213 as a drain region similar to the embodiment 1 and to form a pinchoff point on the side closer to the drain region in the channel region. More specifically, in reading information stored in either one of two memory function bodies, the pinch-off point is preferably formed in a region closer to the other memory function body in the channel region. This makes it possible to detect memory information in the memory function body 261 with good sensitivity regardless of the storage condition of the memory function body 262, resulting in large contribution to implementation of two-bit operation.

In the case of storing information only in one side out of the two memory function bodies, or in the case of using these two memory function bodies in the same storing condition, a pinch-off point is not necessarily formed in read operation.

Although not shown in FIG. 8, a well region (P type well in the case of N-channel device) is preferably formed on the surface of the semiconductor substrate 211. Forming the well region facilitates control of other electric characteristics (withstand voltage, junction capacitance, and short channel effect) while maintaining impurity concentration of the channel region optimum for memory operation (rewrite operation and read operation).

Figure 12:
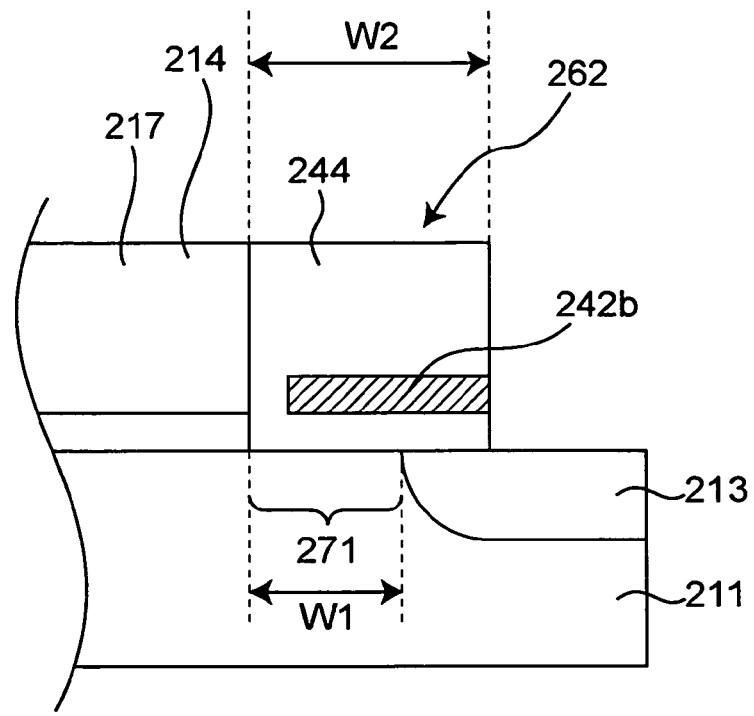
FIG. 12 is a schematic sectional view of an essential part of a modification of the memory element in the semiconductor storage device of the second embodiment.

Also, it is preferable that the memory function body contains a charge retaining film disposed approximately parallel to the surface of the gate insulating film. In other words, it is preferable that the surface of the charge retaining film in the memory function body is disposed so as to have a constant distance from the surface of the gate insulating film. More particularly, as shown in FIG. 12, a silicon nitride film 242b as an electric charge retention film in the memory function body 262 has a face approximately parallel to the surface of the gate insulating film 214. In other words, the silicon nitride film 242b is preferably formed to have a uniform height from the height corresponding to the surface of the gate insulating film 214.

The presence of the silicon nitride film 242b approximately parallel to the surface of the gate insulating film 214 in the memory function body 262 makes it possible to effectively control easiness of formation of an inversion layer in the offset region 271 with use of an amount of electric charges stored in the charge retention film 242b, thereby enabling increase of memory effect. Also, by placing the silicon nitride film 242b approximately parallel to the surface of the gate insulating film 214, change of memory effect may be kept relatively small even with a dispersed offset amount (W1), enabling restraint of memory effect dispersion. In addition, movement of electric charges toward upper side of the silicon nitride film 242b may be suppressed, and therefore characteristic change due to the movement of electric charges during memory holding may be restrained.

Furthermore, the memory function body 262 preferably contains an insulating film (e.g., a portion of the silicon oxide film 244 on the offset region 271) that separates the silicon nitride film 242b approximately parallel to the surface of the gate insulating film 214 from the channel region (or the well region). This insulating film may restrain dissipation of the electric charges stored in the charge retention film, thereby contributing to obtaining a memory device with better holding characteristics.

It is noted that controlling the film thickness of the silicon nitride film 242b as well as controlling the film thickness of the insulating film under the silicon nitride film 242b (a portion of the silicon oxide film 244 on the offset region 271) to be constant make it possible to keep the distance from the surface of the semiconductor substrate to the electric charges stored in the charge retention film approximately constant. More particularly, the distance from the surface of the semiconductor substrate to the electric charges stored in the charge retention film may be controlled to be within the range from a minimum film thickness value of the insulating film under the silicon nitride 242b to the sum of a maximum film thickness of the insulating film under the silicon nitride film 242b and a maximum film thickness of the silicon nitride film 242b. Consequently, the concentration of electric line of force generated by the electric charges stored in the silicon nitride film 242b may be roughly controlled, and therefore dispersion of the degree of memory effect of the memory device may be minimized.

Third Embodiment

Figure 13:
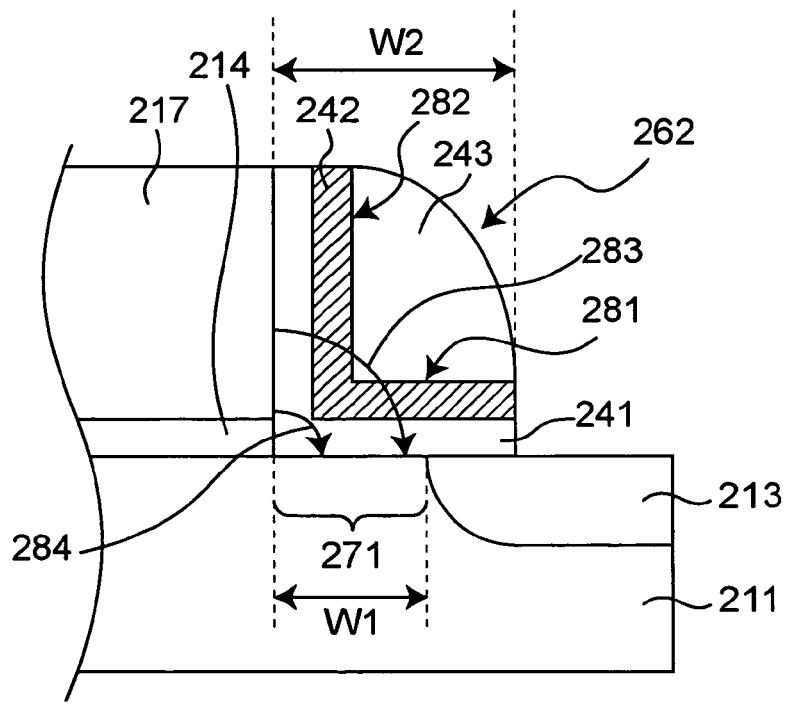
FIG. 13 is a schematic sectional view of an essential part of a memory element in a semiconductor storage device of a third embodiment of the present invention.

In this embodiment, a silicon nitride film 242 as a film made of a first insulator in the charge holding portion 262 has an approximately uniform film thickness as shown in FIG. 13. Further, the silicon nitride film 242 as a charge retention film is configured such that a region 281 having a constant thickness and disposed approximately parallel to the surface of the gate insulating film 214 and a region 282 extending in direction approximately parallel to the side face of the gate electrode 217.

When a positive voltage is applied to the gate electrode 217, electric line of force in the memory function body 262 passes the silicon nitride film 242 total two times through the first portion 281 and the second portion 282 as shown with an arrow 283. It is noted that when a negative voltage is applied to the gate electrode 217, the direction of electric line of force is reversed. Herein, a dielectric constant of the silicon nitride film 242 is approx. 6, while a dielectric constant of silicon oxide films 241, 243 is approx. 4. Eventually, an effective dielectric constant of the memory function body 262 in the direction of electric line of force (arrow 283) becomes larger than that in the case where the charge retention film includes only the first portion 281, which makes it possible to decrease potential difference between the both edges of the electric line of force. More specifically, much part of the voltage applied to the gate electrode 217 is used to reinforce electric fields in the offset region 271.

Electric charges are injected into the silicon nitride film 242 in rewrite operation because generated electric charges are pulled by electric fields in the offset region 271. As a consequence, the silicon nitride film 242 including the second portion 282 increases the electric charges injected into the memory function body 262 in rewrite operation, thereby increasing a rewrite speed.

In the case where the portion of the silicon oxide film 243 is a silicon nitride film, more specifically, in the case where the charge retention film is not flat against the height corresponding to the surface of the gate insulating film 214, movement of electric charges toward upper side of the silicon nitride film becomes outstanding, and holding characteristics are deteriorated.

Instead of silicon nitride film, the charge retention film is more preferably formed from high-dielectric substances such as hafnium oxide having extremely large dielectric constant.

Further, the memory function body more preferably includes an insulating film (a portion of the s241 on the silicon oxide film on the offset region 271) that separates the charge retention film approximately parallel to the surface of the gate insulating film from the channel region (or the well region). This insulating film may restrain dissipation of the electric charges stored in the charge retention film, thereby enabling further improvement of holding characteristics.

Also, the memory function body more preferably includes an insulating film (a portion of the silicon oxide film 241 in contact with the gate electrode 217) that separates the gate electrode from the charge retention film extending in the direction approximately parallel to the side face of the gate electrode. This insulating film may prevent injection of electric charges from the gate electrode into the charge retention film and prevent change of electric characteristics, which may increase reliability of the memory device.

Further, similar to the second embodiment, it is preferable that the film thickness of the insulating film under the silicon nitride film 242 (a portion of the silicon oxide film 241 on the offset region 271) is controlled to be constant, and further the film thickness of the insulating film disposed on the side face of the gate electrode (a portion of the silicon oxide film 241 in contact with the gate electrode 217) is controlled to be constant. Consequently, the concentration of electric line of force generated by the electric charges stored in the silicon nitride film 242 may be roughly controlled, and leakage of electric charges may be prevented.

Fourth Embodiment

In this embodiment, optimization of the distance between a gate electrode, a memory function body, and a source/drain region is explained.

Figure 14:
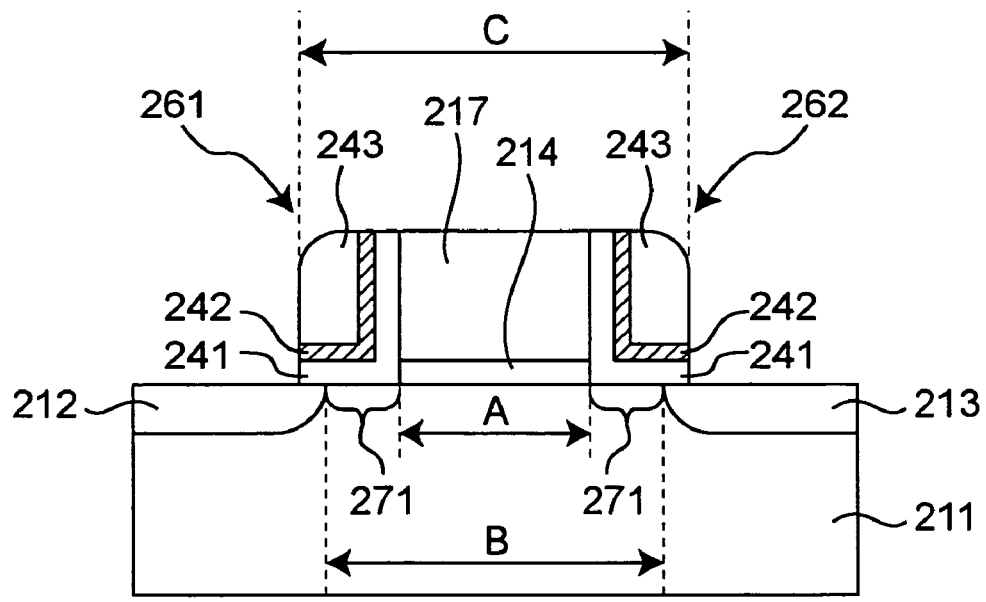
FIG. 14 is a schematic sectional view of an essential part of a memory element in a semiconductor storage device of a fourth embodiment of the present invention.

As shown in FIG. 14, reference symbol A denotes a gate electrode length in the cross section in channel length direction, reference symbol B denotes a distance (channel length) between source and drain regions, and reference symbol C denotes a distance from the edge of one memory function body to the edge of the other memory function body, more specifically a distance from the edge of a film (the side away from the gate electrode) having a function of holding the electric charges in one charge holding portion in the cross section in channel length direction to the edge of a film 242 (the side away from the gate electrode 217) having a function of holding the electric charges in the other memory function body 262.

A relationship of A<B is preferable. When this relationship is satisfied, 1 n the channel region, there is present an offset region 271 between a portion under the gate electrode 217 and the source/drain regions 212, 213. Thereby, the electric charges stored in the memory function bodies 261, 262 (silicon nitride film 242) effectively change easiness of inversion in the entire part of the offset region 271. As a result, memory effect is increased, and high-speed read operation is particularly enabled.

Also, when the gate electrode 217 and the source/drain regions 212, 213 are offset, that is, when the relationship of A<B is satisfied, easiness of inversion of the offset region when a voltage is applied to the gate electrode 217 is largely changed by an electric charge amount stored in the memory function bodies 261, 262. Consequently, memory effect increases and short channel effect can be reduced.

However, as long as the memory effect is effective, the offset region is not necessarily required. Even when the offset region 271 is not present, if the impurity concentration in the source/drain regions 212, 213 is sufficiently small, the memory effect can still be effective in the memory function bodies 261, 262 (silicon nitride film 242).

While, as described referring to FIG. 11, a memory function can not be obtained unless at least part of the silicon nitride film 242a is overlapped with the source/drain region 212, 213. Consequently, a relationship of B<C is preferably satisfied. Therefore, the state of A<B<C is most preferable.

Fifth Embodiment

Figure 15:
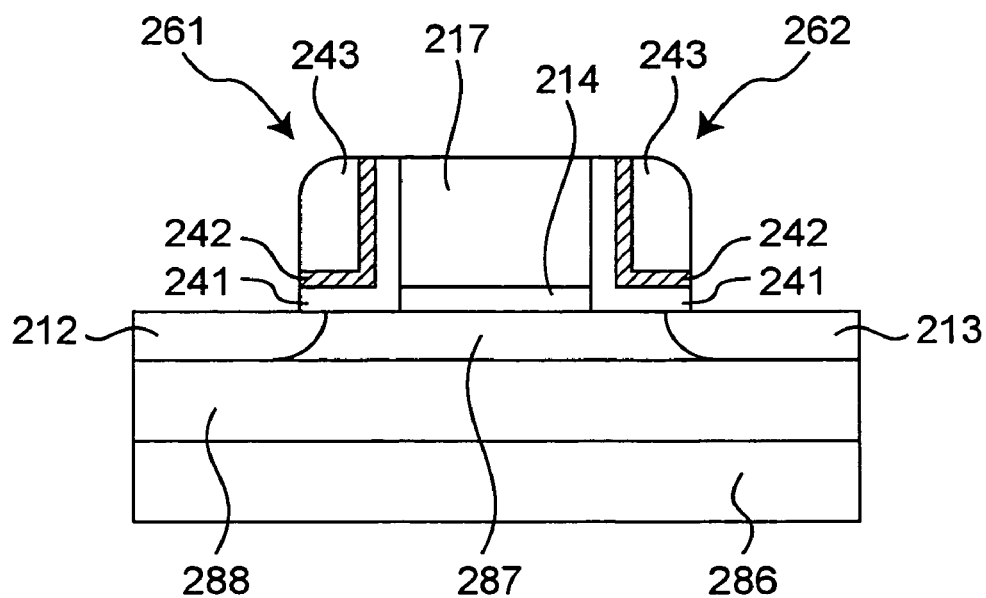
FIG. 15 is a schematic sectional view of an essential part of a memory element in a semiconductor storage device of a fifth embodiment of the present invention.

A memory device of semiconductor storage device according to this embodiment has essentially the same structure as that in the second embodiment except that the semiconductor substrate is SOI substrate as shown in FIG. 15.

The memory device is structured such that an embedded oxide film 288 is formed on a semiconductor substrate 286, and on top of the embedded oxide film 288, SOI layer is further formed. In the SOI layer, there are formed diffusion regions 212, 213, and other areas constitute a body region 287.

This memory device also brings about the functions and effects similar to those of the memory device in the second embodiment. Further, since the junction capacitance between the diffusion regions 212, 213 and the body region 287 may be considerably reduced, it becomes possible to increase a device speed and to decrease power consumption.

Sixth Embodiment

Figure 16:
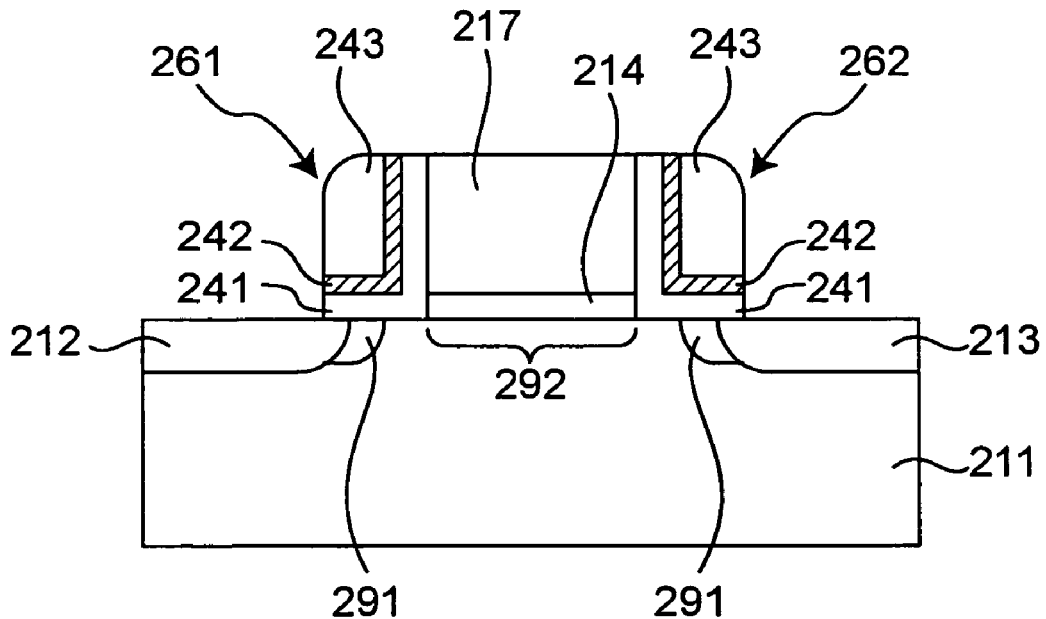
FIG. 16 is a schematic sectional view of an essential part of a memory element in a semiconductor storage device of a sixth embodiment of the present invention.

A memory device in this embodiment has essentially the same structure as that in the second embodiment except that in the vicinity of the channel side of N type diffusion regions 212, 213, a P type highly-concentrated region 291 is added as shown in FIG. 16.

More specifically, the concentration of P type impurity (e.g., boron) in the P type highly-concentrated region 291 is higher than the concentration of P type impurity in the region 292. An appropriate value of the P type impurity concentration in the P type highly-concentrated region 291 is, for example, around $5 \times 10^{17}$ to $1 \times 10^{19}$ cm$^{-3}$. Also, a value of the P type impurity concentration in the region 292 may be set to, for example, $5 \times 10^{16}$ to $1 \times 10^{18}$ cm$^{-3}$.

Thus, providing the P type highly-concentrated region 291 makes the junction between the diffusion regions 212, 213 and the semiconductor substrate 211 steep right under the memory function bodies 261, 262. This facilitates generation of hot carriers in write and erase operation, thereby enabling reduction of voltage in write operation and erase operation or implementing high-speed write operation and erase operation. Further, since the impurity concentration in the region 292 is relatively small, a threshold value when the memory is in erased state is small and so the drain current becomes large. Consequently, a read speed is increased. This makes it possible to provide a memory device having low rewrite voltage or a high rewrite speed, and having a high read speed.

Also in FIG. 16, by providing the P type highly-concentrated region 291 in a position adjacent to the source/drain region and on the lower side of the memory function bodies 261, 262 (that is a position not right under the gate electrode), a threshold value of the entire transistor shows considerable increase. The degree of this increase is extremely larger than that in the case where the P type highly-concentrated region 291 is right under the gate electrode. When write electric charges (electrons in the case where the transistor is N channel type) are stored in the memory function bodies 261, 262, the difference becomes larger. When enough erase electric charges (positive holes in the case where the transistor is N channel type) are stored in the memory function body, a threshold value of the entire transistor is decreased down to a value determined by the impurity concentration in the channel region (region 292) under the gate electrode 217. More specifically, the threshold value in the erased state is not dependent on the impurity concentration in the P type highly-concentrated region 291, whereas the threshold value in the written state receives extremely large influence. Therefore, disposing the P type highly-concentrated region 291 under the memory function bodies and adjacent to the source/drain region imparts extremely large fluctuation only to the threshold value in the written state, thereby enabling remarkable increase of memory effect (difference of threshold values in the erased state and the written state).

Seventh Embodiment

Figure 17:
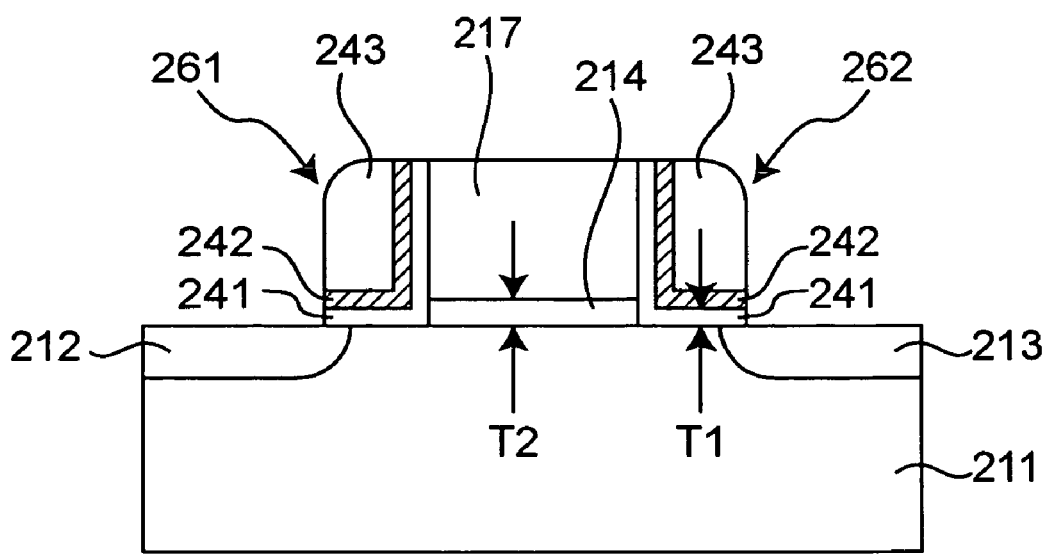
FIG. 17 is a schematic sectional view of an essential part of a memory element in a semiconductor storage device of a seventh embodiment of the present invention.

A memory function body of a semiconductor storage device in this embodiment has essentially the same structure as that in the second embodiment except that the thickness T1 of the insulating film 241 that separates the charge retention film (silicon nitride film 242) from the channel region or the well region 211 is smaller than the thickness T2 of the gate insulating film 214 as shown in FIG. 17.

The gate insulating film 214 has a lower limit of the thickness T2 because of the request for withstand voltage in memory rewrite operation. However, the thickness T1 of the insulating film 241 can be smaller than T2 regardless of the request for withstand voltage.

In the memory device of the present embodiment, the thickness T1 of the insulating film has high design freedom as stated above because of the following reason. In the memory device, the insulating film 241 that separates the charge retention film (silicon nitride 242) from the channel region or the well region is not interposed in between the gate electrode 217 and the channel region or the well region. Consequently, the insulating film 241 that separates the charge retention film (silicon nitride 242) from the channel region or the well region does not receive direct influence from the high-electric fields that affect in between the gate electrode 217 and the channel region or the well region, but receives influence from relatively weak electric fields expanding from the gate electrode 217 in lateral direction. As a result, despite the request for withstand voltage to the gate insulating film 214, it becomes possible to make T1 smaller than T2. Decreasing the thickness T1 of the insulating film facilitates injection of electric charges into the memory function bodies 261, 262, decreases voltage for write operation and erase operation, or enables high-speed write operation and erase operation. In addition, since an electric charge amount induced in the channel region or the well region increases when electric charges are stored in the silicon nitride film 242, increased memory effect may be implemented.

Some electric lines of force having short length in the memory function body do not pass the silicon nitride film 242 as shown with an arrow 284 in FIG. 13. Since electric field strength is relatively large on such a short electric line of force, the electric fields along the electric line of force plays an important role in rewrite operation. By decreasing the thickness T1 of the insulating film 241, the silicon nitride film 242 moves to the lower side of the FIG. 13, so that the electric line of force shown with the arrow 284 passes the silicon nitride film 242. As a consequence, an effective dielectric constant in the memory function body along the electric line of force 284 in the direction of arrow 284 becomes large, which makes it possible to make potential difference between the both ends of the electric line of force 284 smaller. Therefore, most part of voltage applied to the gate electrode 217 is used to strengthen the electric fields in the offset region, thereby implementing high-speed write operation and erase operation.

Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory device.

As is clear from the above, by setting the thickness T1 of the insulating film 241 and the thickness T2 of the gate insulating film 214 as T1<T2, it becomes possible to decrease voltage in write operation and erase operation or implement high-speed write operation and erase operation, and to enable further increase of memory effect without degrading withstand voltage capability of the memory. It is noted that the thickness T1 of the insulating film is preferably 0.8 nm or more, that is the limit range in which uniformity in manufacturing process or certain level of film quality may be maintained and holding characteristics do not suffer extreme deterioration.

More specifically, in the case of liquid crystal driver LSI which has a severe design rule and requires high withstand voltage, maximum 15 to 18V voltage is necessary for driving liquid crystal panel TFT (Thin Film Transistor). Eventually, it is not possible to make the gate oxide film thinner. In the case of mounting a nonvolatile memory of the present invention as an image adjuster together with other devices on the liquid crystal driver LSI, the memory device of the present invention enables optimum design of the thickness of the insulating film that separates the charge retention film (silicon nitride film 242) from the channel region or the well region independently of the thickness of the gate insulating film. For example, in a memory cell with a gate electrode length (word line width) of 250 nm, there may be separately set like T1=20 nm and T2=10 nm, fulfilling a memory cell with good write efficiency. (Short channel effect is not generated even though T1 is larger than that of normal logic transistors, because the source/drain region is offset from the gate electrode.)

Eighth Embodiment

Figure 18:
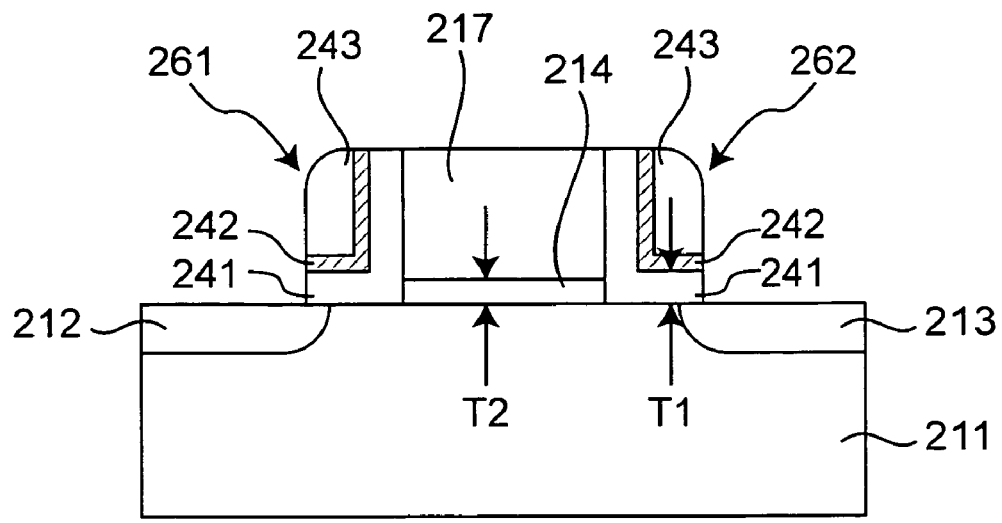
FIG. 18 is a schematic sectional view of an essential part of a memory element in a semiconductor storage device of an eighth embodiment of the present invention.

A memory device of a semiconductor storage device according to this embodiment has essentially the same structure as that in the second embodiment except that the thickness (T1) of the insulating film that separates the charge retention film (silicon nitride film 242) from the channel region or the well region is larger than the thickness (T2) of the gate insulating film as shown in FIG. 18.

The gate insulating film 214 has an upper limit of the thickness T2 because of the request for prevention of short channel effect of the device. However, the thickness T1 of the insulating film 241 can be larger than T2 regardless of the request for prevention of short channel effect. More specifically, as miniaturization scaling proceeds (thinning of the gate insulating film proceeds), the thickness of the insulating film that separates the charge retention film (silicon nitride film 242) from the channel region or the well region may be optimally designed independently of the thickness T2 of the gate insulating film, which implements the effect that the memory function body will not disturb scaling.

In the memory device of the present embodiment, the thickness T1 of the insulating film has high design freedom as stated above because, as is already described, the insulating film that separates the charge retention film from the channel region or the well region is not interposed in between the gate electrode and the channel region or the well region. As a result, despite the request for prevention of short channel effect to the gate insulating film, it becomes possible to make T1 larger than T2.

Increasing the thickness of the insulating film makes it possible to prevent dissipation of the electric charges stored in the memory function body and to improve holing characteristics of the memory.

Therefore, setting as T1>T2 enables improvement of holding characteristics without deteriorating short channel effect of the memory.

It is noted that the thickness T1 of the insulating film is preferably 20 nm or less in consideration of reduction of a rewrite speed.

More specifically, a conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight. In the memory device of the present invention, independent designing of T1 and T2 is available as described above, and therefore miniaturization becomes possible.

In the present invention, for example, in a memory cell with a gate electrode length (word line width) of 450 nm, there is separately set like T2=4 nm and T1=7 nm, fulfilling a semiconductor storage device free from generation of short channel effect. Short channel effect is not generated even though T2 is set larger than that of normal logic transistors, because the source/drain region is offset from the gate electrode.

Also, since the source/drain region is offset from the gate electrode in the memory device of the present invention, miniaturization is further facilitated compared to normal logic transistors.

As described above, since an electrode for supporting write and erase operation is not present above the memory function body, the insulating film that separates the charge retention film from the channel region or the well region does not directly receive the influence of high electric fields that affect in between the electrode that supports write and erase operation and the channel region or the well region, but receives influence only from relatively weak electric fields expanding from the gate electrode in lateral direction. This makes it possible to fulfill a memory cell having the gate length miniaturized more than the gate length of the logic transistors in comparison with the same processing accuracy.

Ninth Embodiment

This embodiment relates to changes of electric characteristics when rewrite operation is performed in the memory device of the semiconductor storage device according to the present invention.

Figure 19:
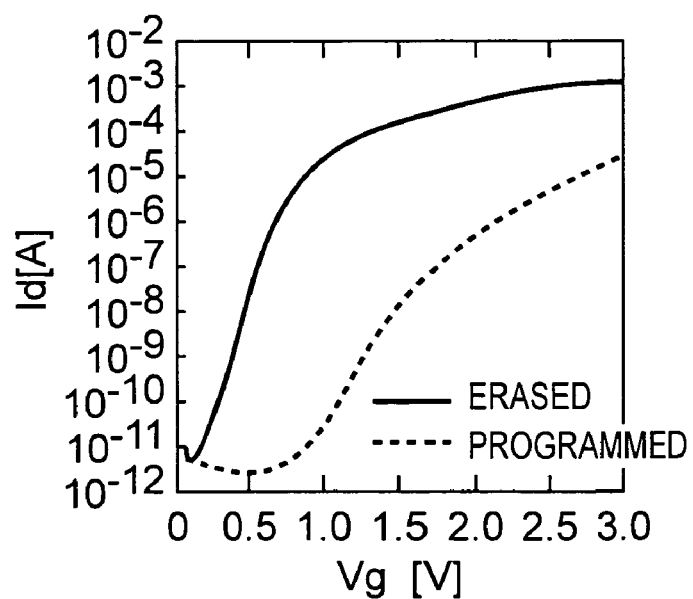
FIG. 19 is a graph showing the electrical characteristic of a memory element in a semiconductor storage device of a ninth embodiment of the present invention.

FIG. 19 is a view showing characteristic curves of a drain current (Id) versus a gate voltage (Vg) (measured values) where an electric charge amount in the memory function body of an N-channel type memory device varies between erase state and written state.

Figure 42:
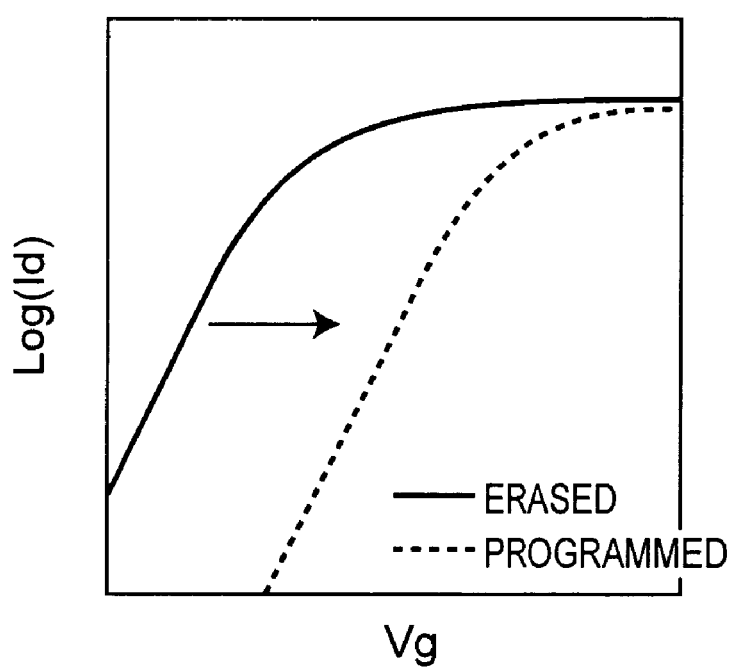
FIG. 42 is a graph showing the electrical characteristic of the conventional flash memory.

As clearly shown in FIG. 19, when write operation is performed in the erased state (a solid line), as shown by a broken line, not only the threshold value simply rises, but inclination of the graph dramatically falls especially in sub-threshold region. Therefore, even in the region with relatively high gate voltage (Vg), a drain current ratio of the erased state to the written state is large. For example in the point of Vg=2.5V, the current ratio is still two digits or more. This characteristic is largely different from that in the case of a flash memory shown in FIG. 42.

The appearance of the above characteristic in the memory device is a phenomenon peculiar to the case where the gate electrode and the diffusion region are offset and therefore the gate electric fields are difficult to reach the offset region. When the memory device is in the written state, an inversion layer is extremely difficult to be generated in the offset region below the memory function body even if a positive voltage is applied to the gate electrode. This causes smaller inclination of the Id-Vg curve line in the sub-threshold region in the written state.

When the memory device is in the erased state, high-density electrons are induced in the offset region. Further, when 0V is applied to the gate electrode (i.e., in OFF state), electrons are not induced in the channel below the gate electrode (and therefore an off current is small). This causes large differential coefficient of the Id-Vg curve line in the sub-threshold region in the erased state and a large increase rate of current (conductance) even in the voltage region over the threshold.

As is clear from the above description, the memory device of the semiconductor storage device according to the present invention makes it possible to make the drain current ratio of the erased state to the written state particularly large.

Tenth Embodiment

Figure 20:
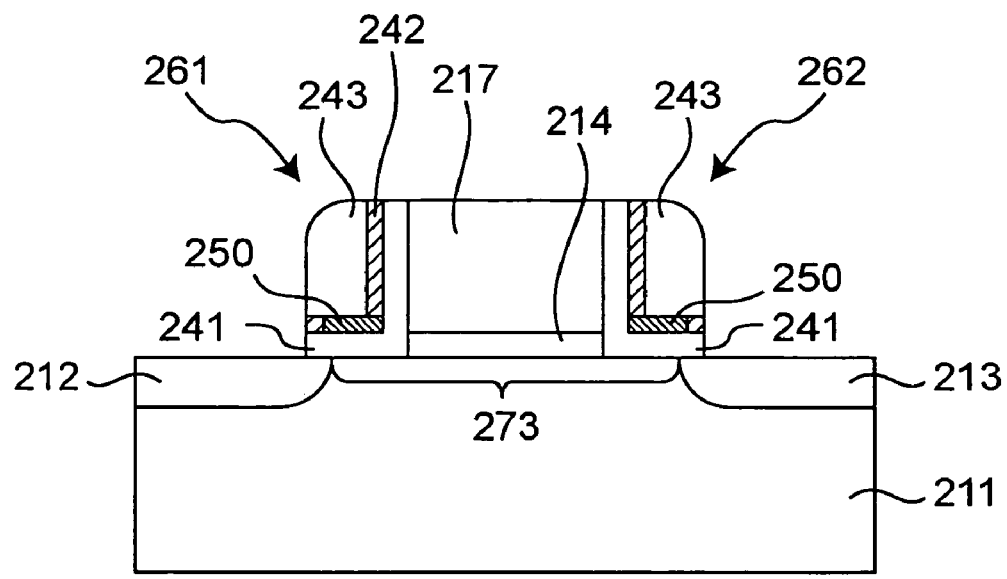
FIG. 20 is a schematic view of a charge storage region of the memory element shown in FIG. 8.

Each of the charge retention films provided for the aforementioned memory function bodies 105*a*, 105*b*, 131*a*, 131*b*, 261 and 262 includes a portion that extends in the channel-length direction from the gate electrode sidewall to partially overlap the source/drain diffusion regions as illustrated in the corresponding figures. The above-mentioned portion partially or wholly serves as a charge storage region extended over part of the channel region and part of the diffusion region, straddling a boundary therebetween. In this case, the charge storage region indicates a region in which electric charges injected by the memory element rewrite operation are actually retained and which fulfills a primary function of the charge retention film, out of the entire region thereof. For example, in the memory element shown in FIG. 8, part of a film portion extended in the channel-length direction of the charge retention film 242 serves as a charge storage region 250 extended over part of a channel region 273 and part of the diffusion region 212, 213, as shown in FIG. 20.

Since the two charge storage regions 250 exist over part of the channel region 273 and part of the diffusion regions 212 and 213, respectively, high-speed read operation of the semiconductor storage device becomes possible. This is because a portion that scarcely receives influence of a gate electric field or an electric field due to electric charges stored in the charge storage regions 250 can be eliminated from the channel region 273. Inversion layer charges are not easily induced in the portion that scarcely receives influence of either of the gate electric field and the electric field due to the electric charges stored in the charge storage regions, and therefore, this becomes a bottleneck to transistor current. However, according to the aforementioned construction, the disadvantage can be prevented. Therefore, high-speed read operation can be achieved by increasing the drain current during the read operation.

Figure 21:
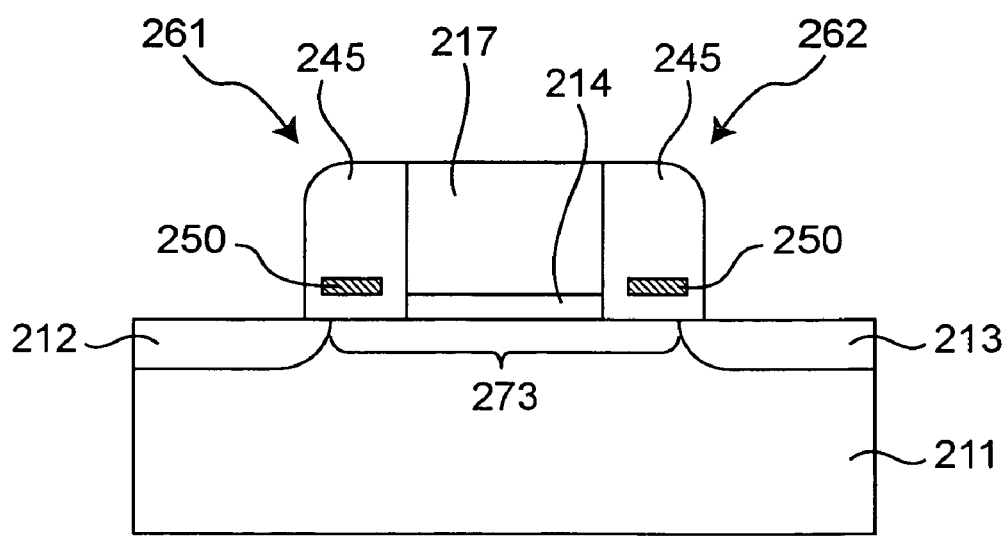
FIG. 21 is a schematic sectional view of a memory element in a semiconductor storage device of a tenth embodiment of the present invention.

FIG. 21 shows a memory element of the tenth embodiment. In this memory element, memory function bodies 261, 262 are formed so that the charge retention film is constructed of only the charge storage region 250. The same components as the components of the memory element shown in FIG. 20 (FIG. 8) are denoted by same reference numerals. In FIG. 21, film-shaped charge storage regions 250 parallel to the surface of the semiconductor substrate 211 are arranged as charge storage regions 250 extended over part of the channel region 273 and part of the diffusion regions 212 and 213. The charge storage regions 250 are formed in insulators 245. The charge storage regions 250 are isolated by the insulators 245 from the semiconductor substrate 211 and the gate electrode 217. The charge storage regions 250 and the insulators 245 constitute memory function bodies 261 and 262.

In this embodiment, the charge storage regions 250 are constructed of any one of a silicon nitride film, aluminum oxide and hafnium oxide, which have a function to trap electric charges, or a laminate film of these materials. The insulators 245 should preferably be constructed of a silicon oxide film, but may be constructed of another insulation film or a plurality of kinds of insulation films.

The memory element of the tenth embodiment can also store two-bit information by independently storing electric charges in each of the two charge storage regions 250 similarly to the aforementioned other memory elements. Moreover, the two charge storage regions 250 are separated apart from each other by the gate electrode 217 similarly to the other memory elements, and therefore, interference during rewrite is effectively restrained. The gate electrode 217, which is put in contact with the semiconductor substrate 211 via only the gate insulation film 214, is therefore able to restrain the short-channel effect by reducing the gate insulation film thickness.

Furthermore, since the two charge storage regions 250 exist over part of the channel region 273 and part of the diffusion regions 212 and 213, high-speed read operation of the semiconductor storage device becomes possible as described above.

Furthermore, the charge storage regions 250 have a film-like shape parallel to the surface of the semiconductor substrate 211. Therefore, as is apparent from the description provided with reference to FIG. 12, easiness of formation of the inversion layer in a portion (offset region) of the channel region 273 existing under the charge storage regions 250 can be effectively restrained, and the memory effect can consequently be increased. Furthermore, variation in the memory effect can be restrained. Therefore, the reliability of the memory element is improved, and the rewrite speed is increased.

Eleventh Embodiment

This embodiment is related to a memory element capable of improving the reliability by preventing deterioration attributed to the repetition of the rewrite operation.

First of all, causes of the deterioration of the memory element due to the repetition of the rewrite operation will be described taking a right-hand side memory function body 262 as an example with reference to FIG. 22 and FIGS. 24 through 29. It is to be noted that no description will be provided for the already mentioned reference numerals.

Figure 22:
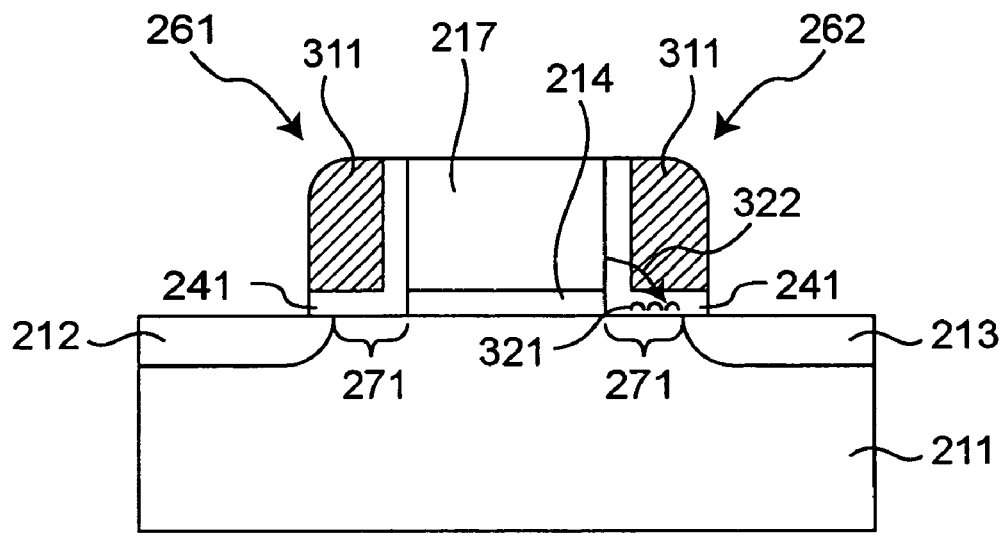
FIG. 22 is a schematic sectional view of a memory element in a semiconductor storage device of an eleventh embodiment of the present invention.

If a write (program) operation or an erase operation is executed in the right-hand side memory function body 262, then hot carriers are generated, and an interface state 321 is generated at the interface between the silicon oxide film 241 and the semiconductor substrate 211 as shown in FIG. 22. This interface state 321 increases as the frequency of rewrite operations increases.

Figure 24:
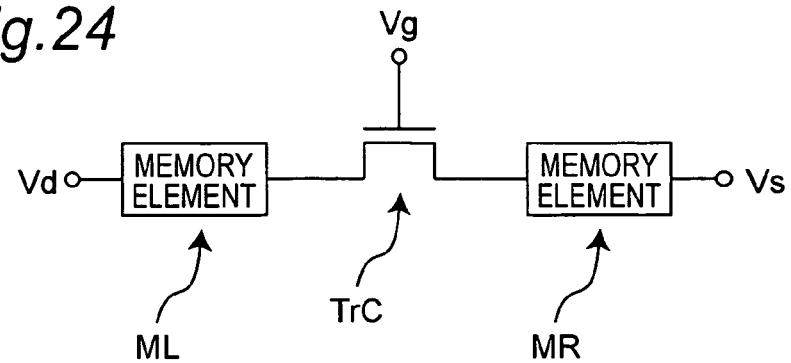
FIG. 24 is an equivalent circuit diagram of the memory element of the semiconductor storage device according to the present invention when performing a nonsaturation-characteristic-region operation.

Now, the function of the memory element of the present invention will be described with reference to FIGS. 24 through 27 that show schematic equivalent circuits of the memory element of the present invention. As shown in FIG. 24, the memory element of the present invention can be regarded as a device in which a transistor TrC formed under the gate insulation film 214 and storage elements ML and MR formed on both sides of the transistor TrC in offset regions 271 are connected in series. The storage elements ML and MR produce a memory effect concretely as a consequence of a change in the value of a current that can be flowed, according to the amount of electric charges stored in the memory function bodies 261 and 262. When a difference between the source voltage (Vs) and the drain voltage (Vd) is sufficiently smaller than a difference between the gate voltage (Vg) and the threshold voltage value, the memory element of the present invention can be expressed by the equivalent circuit shown in FIG. 24 since it performs a nonsaturation-characteristic-region operation. However, when the difference between the source voltage (Vs) and the drain voltage (Vd) becomes sufficiently large, the memory element can be expressed by the equivalent circuit shown in FIG. 25 or 26 since the memory element performs a saturation-characteristic-region operation. That is, because the memory element produces a pinch-off effect on the drain side, the storage element (ML or MR) changes to a resistance (RL or RR) that has a roughly constant resistance value not depending on the amount of electric charges stored in the memory function body. As described above, only one storage element appears in the equivalent circuit when the memory element performs the saturation-characteristic-region operation, and therefore, storage information on a specified side can be separately read.

Figure 25:
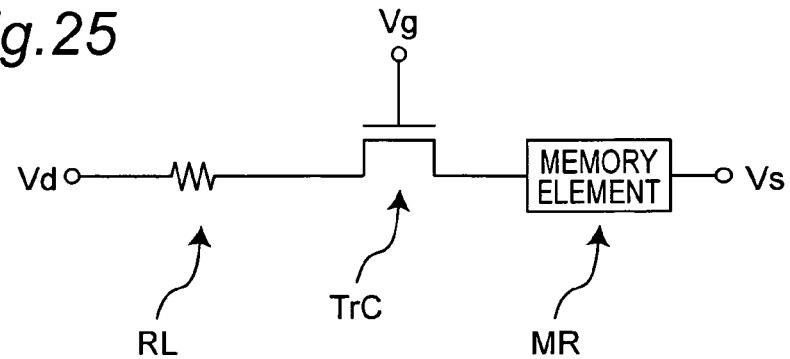
FIG. 25 is an equivalent circuit diagram of the memory element when a right side memory function part is being read.
Figure 26:
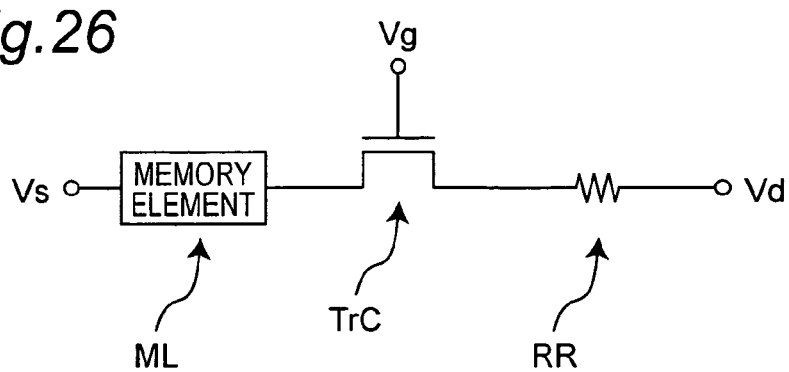
FIG. 26 is an equivalent circuit diagram of the memory element when a left side memory function part is being read.
Figure 27:
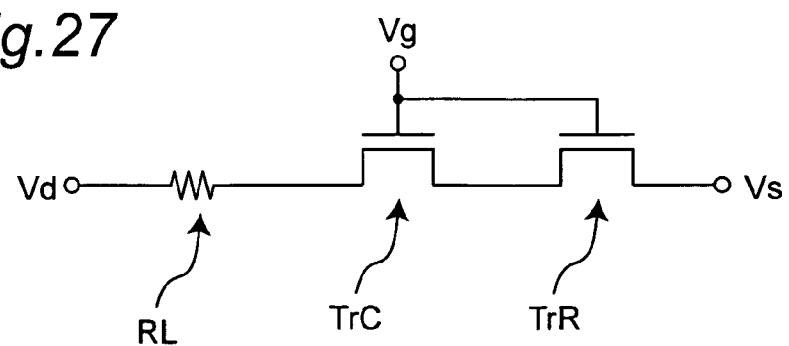
FIG. 27 is another equivalent circuit diagram of the memory element when the right side memory function part is being read.

FIG. 25 shows an equivalent circuit for the case where the right-hand side memory function body 262 is read (the right-hand side memory function body 262 is assumed to be on the source side). The storage element MR can also be considered to be equivalent to a transistor TrR of which the threshold value is changed by the amount of electric charges stored in the right-hand side memory function body 262 (FIG. 27). In this case, the two transistors TrC and TrR can be regarded to be controlled by the single gate electrode 217, and therefore, it is assumed that gate electrodes of these transistors are connected together to receive a common gate voltage Vg applied. The deterioration due to the interface state 321 generated by rewrite operations of the right-hand side memory function body 262 can be regarded as a consequence of the deterioration of the right-hand side transistor TrR.

Figure 28:
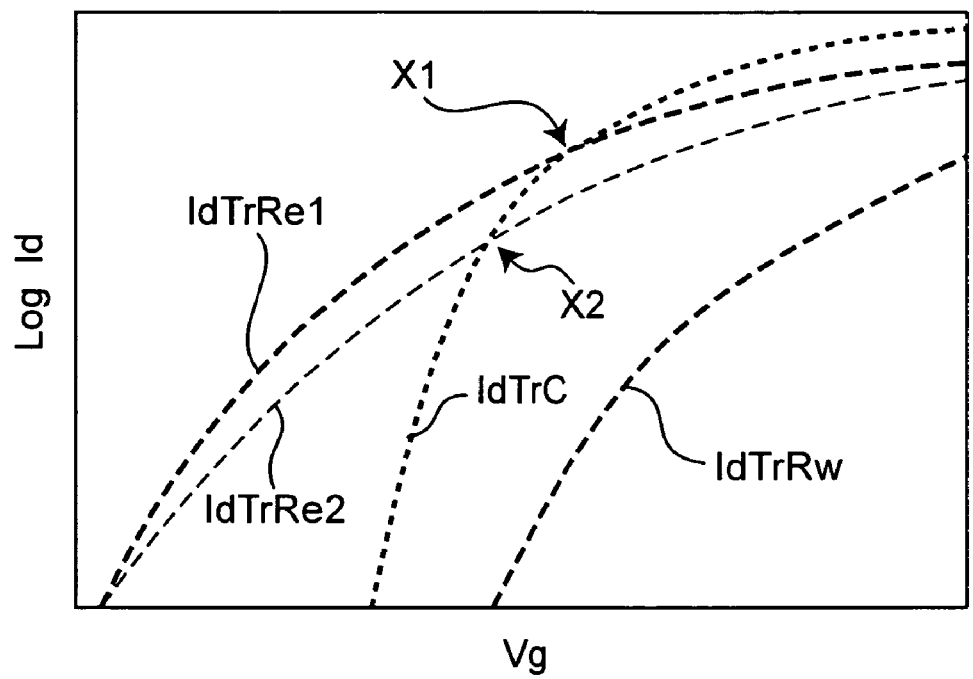
FIG. 28 is a graph schematically describing how the read current Id varies according as the gate voltage Vg is changed during the read operation of the memory element.
Figure 29:
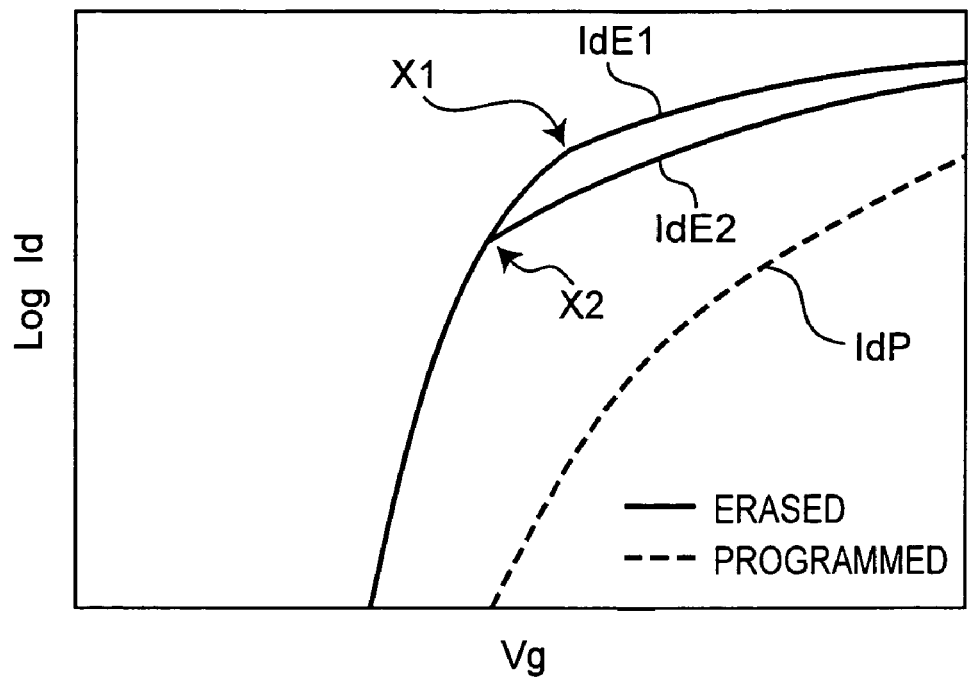
FIG. 29 is a graph showing read current curves when the memory element is in an erased state and in a programmed state, respectively.

FIG. 28 and FIG. 29 are graphs for schematically explaining how a read current Id changes when the gate voltage Vg is changed during the read operation. The vertical axes of the graphs represent the read current Id on a logarithmic basis.

In FIG. 28, a curve IdTrC represents a current that can be flowed by the transistor TrC formed under the gate electrode 217. That is, the current IdTrC represents the driving ability of the transistor TrC. Since no memory effect is produced in the transistor TrC itself, the current IdTrC is constant regardless of the storage state of the right-hand side memory function body 262. Curves IdTrRe1 and IdTrRw represent currents that can be flowed by the right-hand side transistor TrR when the right-hand side memory function body 262 is in an erased state and a programmed (written) state, respectively. As described above, the threshold value of the right-hand side transistor TrR is largely changed by the amount of electric charges stored in the right-hand side memory function body 262.

As is apparent from FIG. 28, the curve IdTrC and the curve IdTrRe1 intersect at point X1. Therefore, in the case where the right-hand side memory function body 262 is in the erased state, the driving ability of the transistor TrC determines the read current Id when Vg is lower than point X1, and the driving ability of the right-hand side transistor TrR determines the read current Id when Vg is higher than point X1. Therefore, the read current Id becomes like a curve IdE1 in FIG. 29. In the case where the right-hand side memory function body 262 is in the written state (programmed state), the driving ability of the right-hand side transistor TrR determines the read current Id at any value of Vg. Therefore, the read current Id becomes like a curve IdP in FIG. 29.

If the right-hand side memory function body 262 is subjected to repeated rewrite operations, then the interface state 321 is generated, and the S-value (sub-threshold swing) of the right-hand side transistor TrR increases, causing a reduction in gm (mutual conductance). Therefore, the current that can be flowed by the right-hand side transistor TrR reduces like a curve IdTrRe2 in FIG. 28. It is to be noted that the increase in the s-value appears in the form of reduction of the slope at the rise of the curve IdTrRe2 in FIG. 28 in comparison with the curve IdTrRe1. At this time, the curve IdTrRe2 and the curve IdTrC intersect at point X2. Eventually, the read current Id during an erase operation after repeated rewrite operations in the memory function body 262 becomes like a curve IdE2 in FIG. 29.

As is apparent from the above description, the read current during an erase operation is reduced from IdE1 to IdE2, and this causes the slowdown of the read operation.

As is apparent from the above description, the reduction in the read current in the erased state is caused by the increase in the s-value of the right-hand side transistor TrR due to the generation of the interface state and the increase in the threshold value. The S-value of the transistor is generally expressed as:

$$S=(kT/q)ln10(1+(Cd+qDit)/Cox) \quad (1)$$

where k is the Boltzmann constant, T is a temperature, q is an elementary charge, Cd is a depletion layer capacitance on the semiconductor substrate side, Dit is an interface state density, and Cox is a gate insulation film capacitance.

According to the equation (1), it can be understood that the s-value increases when the interface state is generated, and the increase in this S-value becomes more remarkable as the Cox becomes smaller. In this case, the thickness of the gate insulation film of the right-hand side transistor TrR corresponds to the length of an electric flux line 322 shown in FIG. 22 and is remarkably thicker than the gate insulation film (gate insulation film 214) of the transistor TrC. That is, the gate insulation film capacitance Cox of the right-hand side transistor TrR is significantly smaller than that of the transistor TrC. Therefore, as understood from the equation (1), the increase in the s-value due to the interface state Dit becomes significant and the driving ability is reduced in the right-hand side transistor TrR. Consequently, the read current of the memory element is significantly reduced.

As an example, assuming that the electric flux line 322 of the right-hand side transistor TrR has a length of 30 nm, the depletion layer located on the semiconductor substrate side has a width of 0.1 μm, the gate insulation film and the memory function body are all constructed of a silicon oxide film (relative permittivity: 4) and the semiconductor substrate is made of silicon (relative permittivity: 11.9) for the sake of simplicity, then the s-value when the interface state density is $10^{10}$ $cm^{-2}$ $eV^{-1}$ is 116 mV/decay. If the interface state density is increased to $10^{12}$ $cm^{-2}$ $eV^{-1}$, then the s-value is largely increased to 196 mV/decay. Assuming that the thickness of the gate insulation film of the right-hand side transistor TrR is equal to that of the transistor TrC (for example, 6 nm), then the s-value when the interface state density is $10^{10}$ $cm^{-2}$ $eV^{-1}$ is 71 mV/decay. However, even if the interface state density is increased to $10^{12}$ $cm^{-2}$ $eV^{-1}$, the s-value is increased only to 87 mV/decay.

The memory element of the present invention has the single gate electrode, and the diffusion regions are offset from the gate electrode. Accordingly, the memory element has a peculiar problem that the effective gate insulation film thickness (arrow 322) in the offset regions 271 is increased and some material that constitutes the memory function body may cause the read current to be significantly reduced by the repetition of the rewrite operation.

Accordingly, in the memory element of the present embodiment, the memory function bodies 261 and 262 include aluminum oxide 311 as a charge retention film as shown in FIG. 22. The aluminum oxide has a relative permittivity of about 9.5, which is greater than a relative permittivity of about 4 of the silicon oxide film and about 6 of the silicon nitride film. Therefore, Cox of the right-hand side transistor TrR is remarkably increased, and the deterioration due to the repetition of the rewrite operation can be largely alleviated. In the case where the length of the electric flux line 322 of the right-hand side transistor is 30 nm, assuming that the memory function body 262 is wholly constructed of aluminum oxide for the sake of simplicity, then the s-value when the interface state density is $10^{10}$ $cm^{-2}$ $eV^{-1}$ is 83 mV/decay. Even if the interface state density is increased to $10^{12}$ $cm^{-2}$ $eV^{-1}$, the s-value is increased only to 117 mV/decay. As is apparent from the above, by making the charge retention film in the memory function body of aluminum oxide, it is possible to not only reduce the s-value before deterioration but also to drastically restrain the increase in the s-value due to deterioration. Therefore, since the read current of the memory element is increased and the reduction in the read current due to deterioration can also be made smaller, it becomes possible to improve the reading speed of the memory element.

Furthermore, since the electron trap level of aluminum oxide has energy deeper than that of the silicon nitride film, the trapped electric charges can be prevented from moving or migrating within the charge retention film. Therefore, the reliability of the memory element is improved.

Furthermore, since only the electron trap exists and no hole trap exists in aluminum oxide, a limit of erasure is determined as when the charge retention film is in a neutral state. Accordingly, when the erase time is increased, the read current settles to a constant value, so that, advantageously, it is easy to set a read reference current value.

Figure 23:
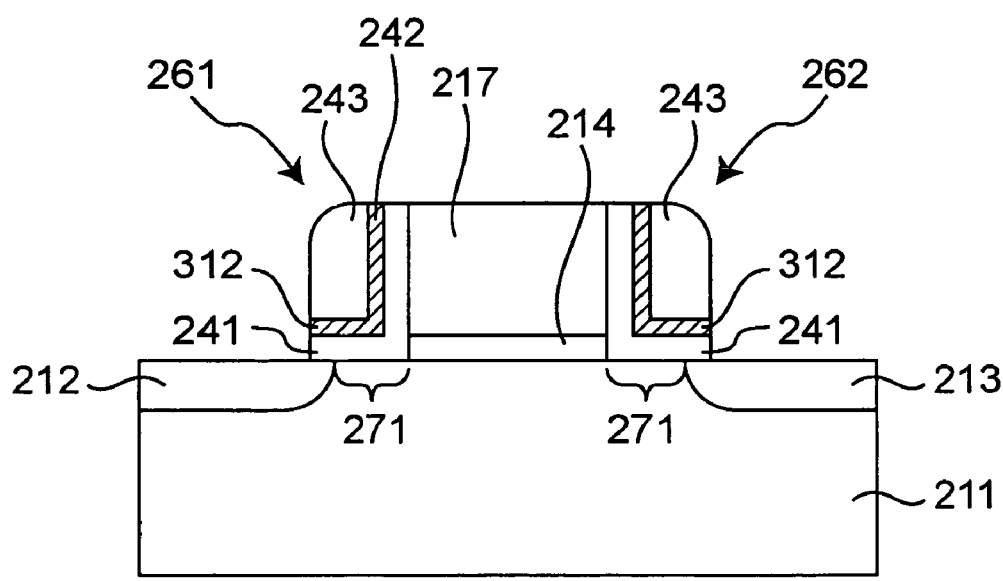
FIG. 23 is a schematic sectional view of a memory element in a semiconductor storage device of a twelfth embodiment of the present invention.

FIG. 23 is a sectional view of a modification example of the memory element shown in FIG. 22. The memory function bodies 261 and 262 have a structure in which an aluminum oxide film 312 having a roughly L-figured cross-sectional shape is placed between silicon oxide films 241 and 243. With the above construction possessed, the variation in the memory effect is restrained similarly to the case of the memory element (a silicon nitride film is employed as a charge retention film) shown in FIG. 8. Furthermore, upward movement of electric charges is restrained, and it is possible to restrain the occurrence of a change in characteristics due to the movement of electric charges during storage retention.

Twelfth Embodiment

This embodiment is related to a memory cell array in which the aforementioned memory elements are arranged.

Figure 30:
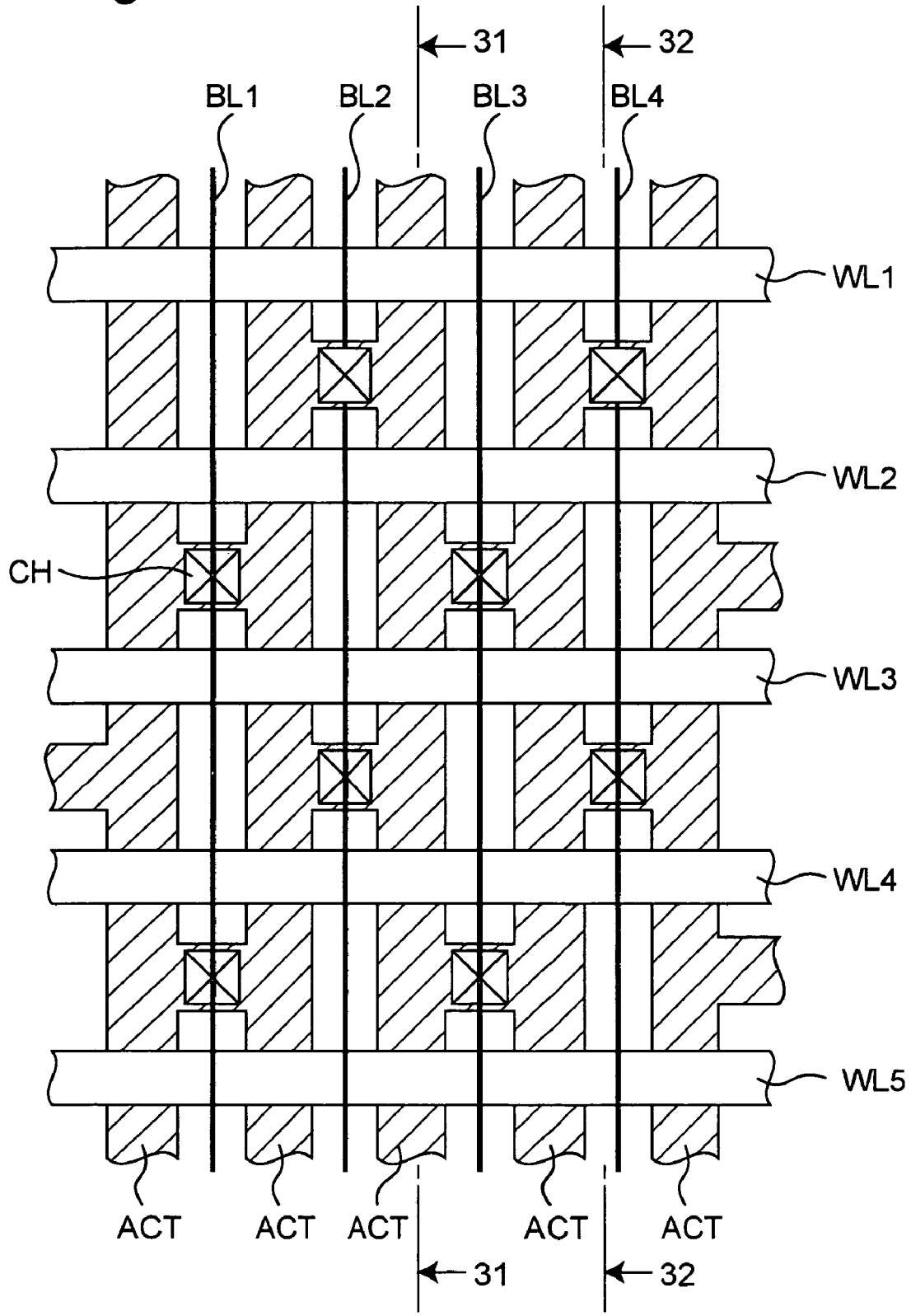
FIG. 30 is a schematic plan view of a memory cell array in the twelfth embodiment of the present invention.
Figure 31:
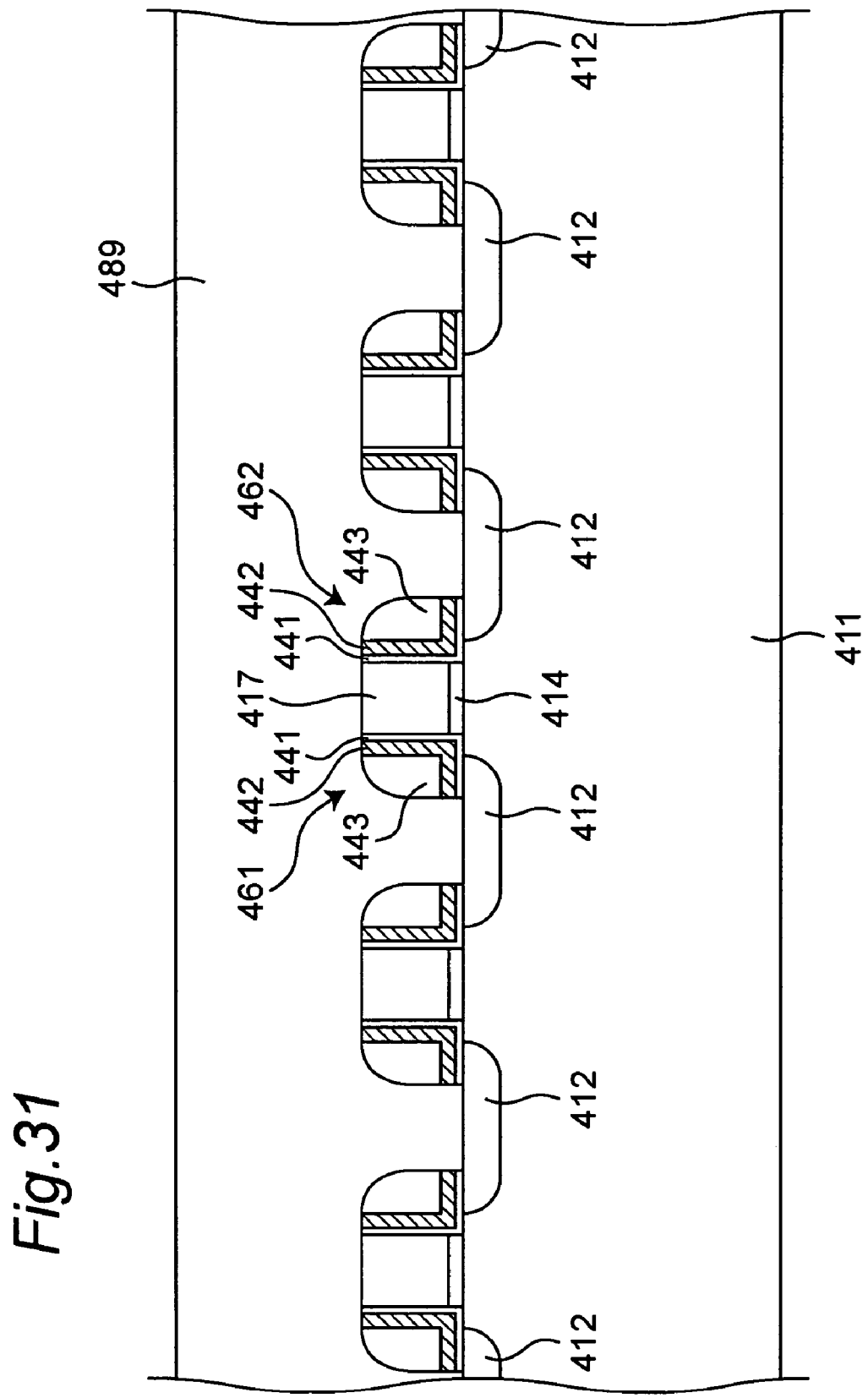
FIG. 31 is a schematic sectional view taken along line 31-31 of FIG. 30.
Figure 32:
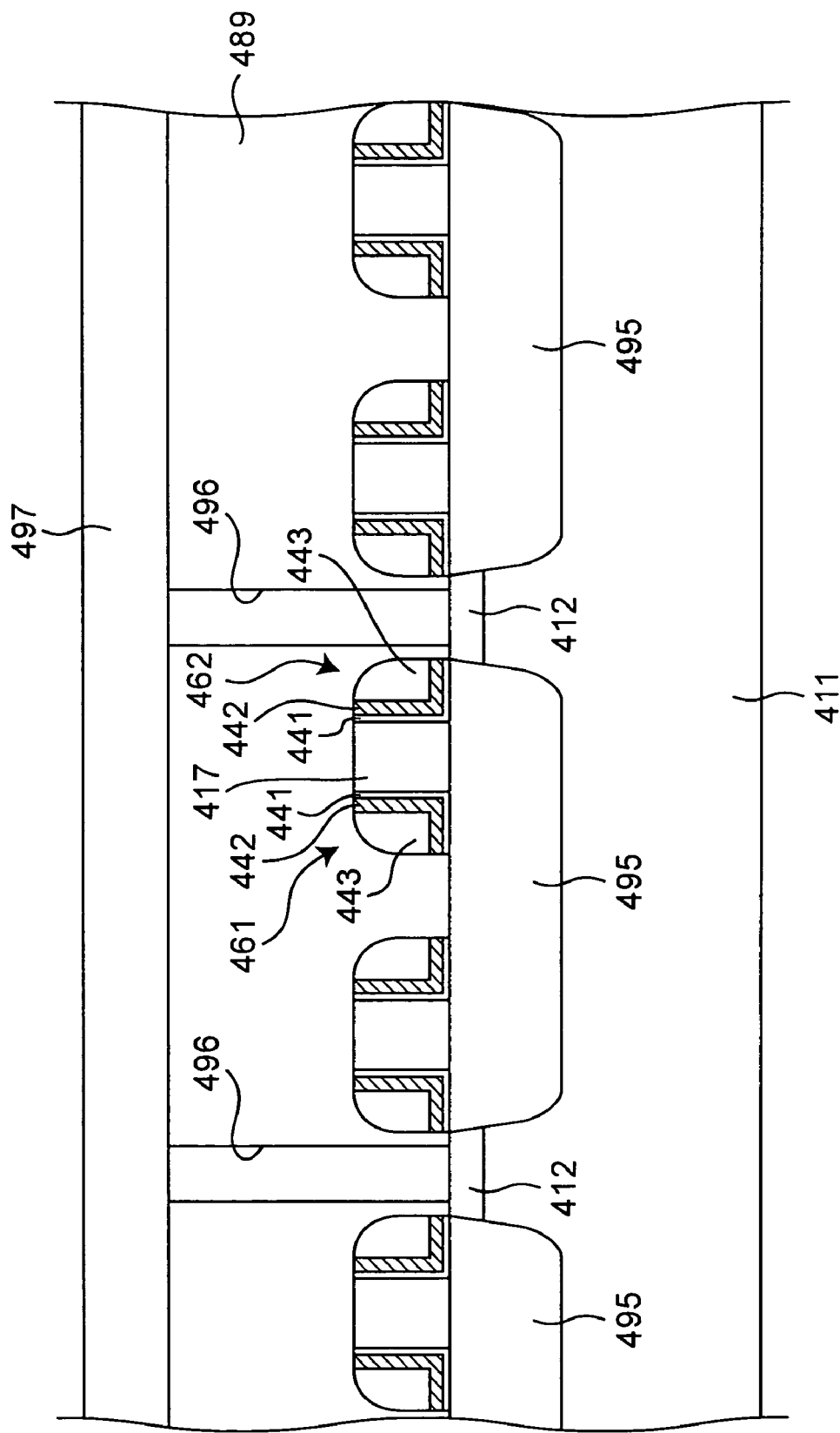
FIG. 32 is a schematic sectional view taken along line 32-32 of FIG. 30.

FIG. 30 is a schematic plan view of the memory cell array. FIG. 31 is a schematic sectional view taken along the line 31-31 of FIG. 30. FIG. 32 is a schematic sectional view taken along the line 32-32 of FIG. 30. It is to be noted that the upper interconnection structure (bit lines) is expressed as a straight line in FIG. 30 for the sake of simplicity. Moreover, although FIG. 30 shows a memory cell array that includes five word lines and four bit lines, the number of rows and the number of columns can be set freely.

Element isolation regions 495 (FIG. 32) are formed in a semiconductor substrate 411. A region of a surface of the semiconductor substrate 411 in which the element isolation regions 495 are not formed serves as an active region ACT. Word lines WL1 through WL5 (417) are extended in the transverse direction of the drawing sheet and arranged side by side in the longitudinal direction of the drawing sheet. Each of the word lines WL1 through WL5 (417) extends above the active regions ACT with a gate insulation film 414 therebetween, and diffusion layer regions 412 are formed on both sides of each word line (in a region that is in an active region and not covered with the word line). A word line (gate electrode) and two diffusion layer regions (source region or drain region) formed on both sides of the word line constitute one field-effect transistor. Memory function bodies 461 and 462, which have a silicon nitride film 442 held by silicon oxide films 441 and 443, are continuously formed on the sidewalls, or side surfaces, of the word lines WL1 through WL5 (417). As shown in FIG. 30, a line of the active region ACT, which extends in a direction intersecting the word lines, is connected to the adjacent lines of the active region ACT alternately between word lines. A contact hole CH (496) is formed on the connection portion of the mutually adjacent active regions ACT. Each contact hole CH (496) electrically connects any one of bit lines BL1 through BL4 (497) extended in the direction intersecting the word lines with the diffusion region 412. With the above arrangement, one diffusion layer region is shared by four field-effect transistors. Reference numeral 489 denotes a layer insulation film.

Figure 33:
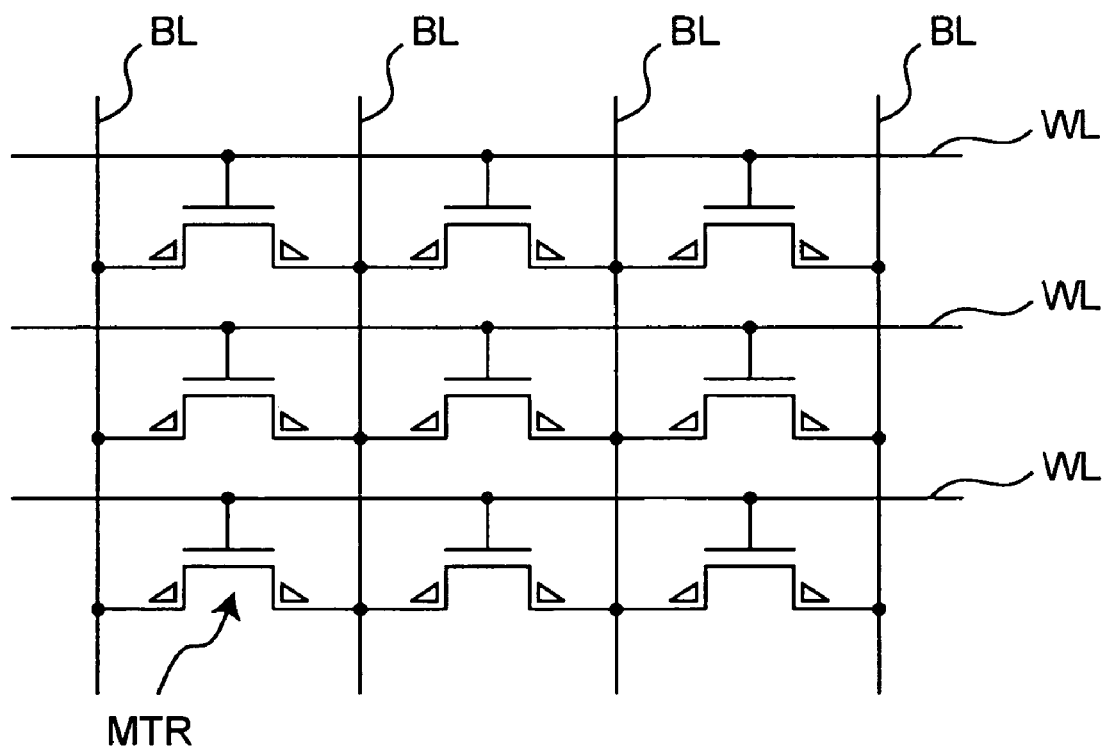
FIG. 33 is an equivalent circuit diagram of the memory cell array in the twelfth embodiment.

FIG. 33 is a schematic equivalent circuit diagram of this memory cell array. Memory elements MTR are formed in an arrayed manner between mutually adjacent bit lines BL, while word lines WL extended in the direction intersecting the bit lines are connected with the gate electrodes of the memory elements. By selecting one pair of mutually adjacent bit lines and one word line, a specified memory element can be selected. By applying an appropriate voltage to the one pair of mutually adjacent bit lines and one word line, the rewrite operation and the read operation of the specified memory element can be executed. Since the concrete examples of the rewrite method and the read method have already been described, no description is herein provided therefor.

The word lines WL1 through WL5 serve as the gate electrodes of the memory elements on the respective active regions ACT. That is, each word line is shared by a plurality of memory elements. Moreover, two memory function bodies 461 and 462 are continuously formed on both sidewalls of each word line, and these memory function bodies 461 and 462 are shared by the plurality of memory elements. As described above, since each word line and the memory function bodies formed on the sidewalls of each word line are shared by a plurality of memory elements, it is possible to reduce the memory cell area and increase the packing density of the memory cell array.

Moreover, as described in connection with the eleventh embodiment, it can be said that the memory element of the present invention is a high-performance element constructed of a select transistor (TrC) and two variable threshold transistors (TrL, TrR). Such a high-performance element is constructed of minimum components (including single word line), and the memory cell array is constructed by arranging the elements. Therefore, it is possible to increase the density of the memory cell array while improving the memory effect.

Figure 34:
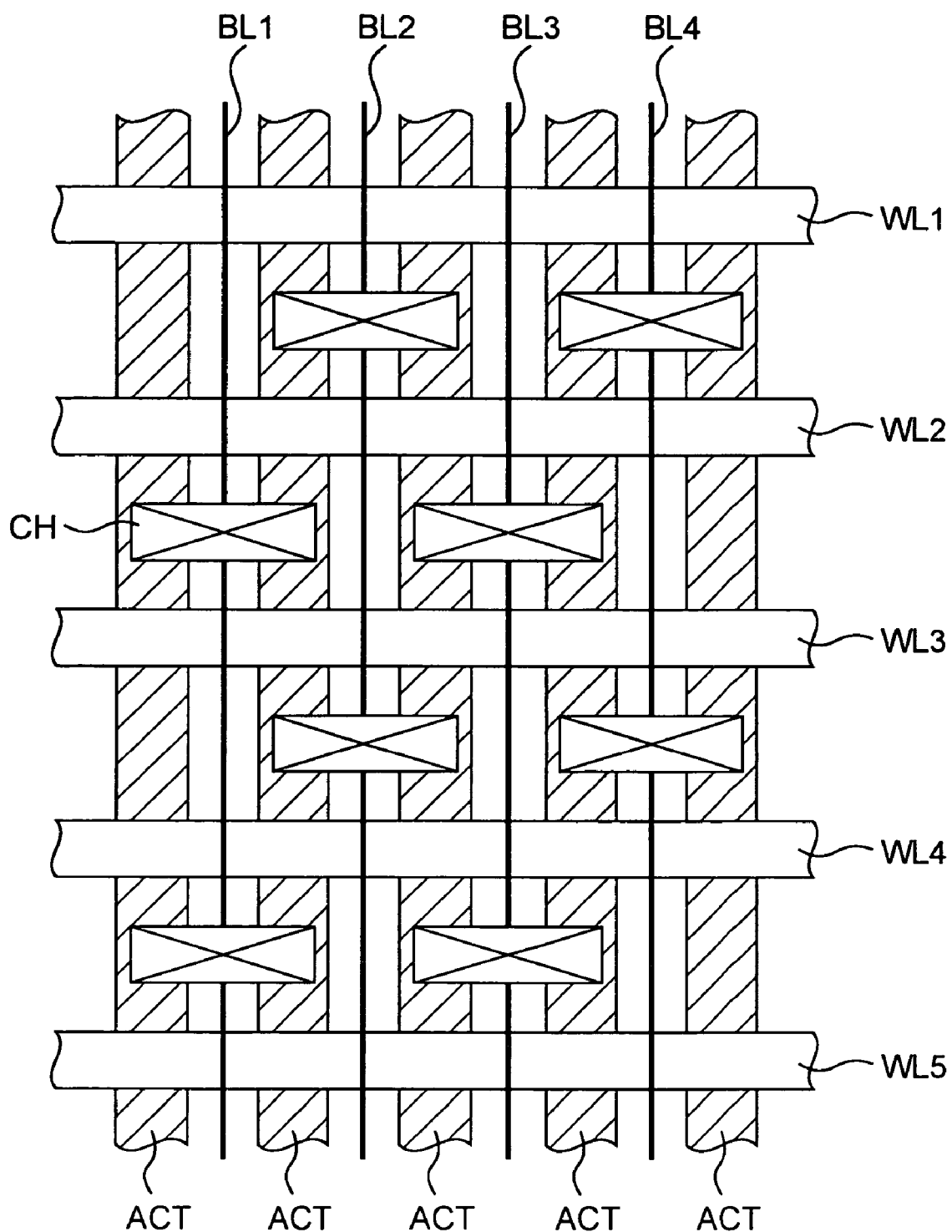
FIG. 34 is a schematic plan view of a modification of the memory cell array shown in FIG. 33.

FIG. 34 is a schematic plan view of a modification example of the memory cell array shown in FIG. 30. The memory cell array shown in FIG. 34 differs from the memory cell array shown in FIG. 30 in that the active regions ACT have a strip-like shape and the adjacent active regions are electrically connected with each other by rectangular (becoming roughly oval when actually processed) contact holes CH. An equivalent circuit diagram of this memory cell array is the same as the one shown in FIG. 33. Since the memory cell array shown in FIG. 34, having active regions ACT and element isolation regions simplified in shape in comparison with the memory cell array shown in FIG. 30, becomes easy to process. Therefore, the yield of an integrated circuit equipped with this memory cell array can be improved. Otherwise, it is possible to shrink the scale of the memory cell array by reducing the margin required for processing.

Figure 35:
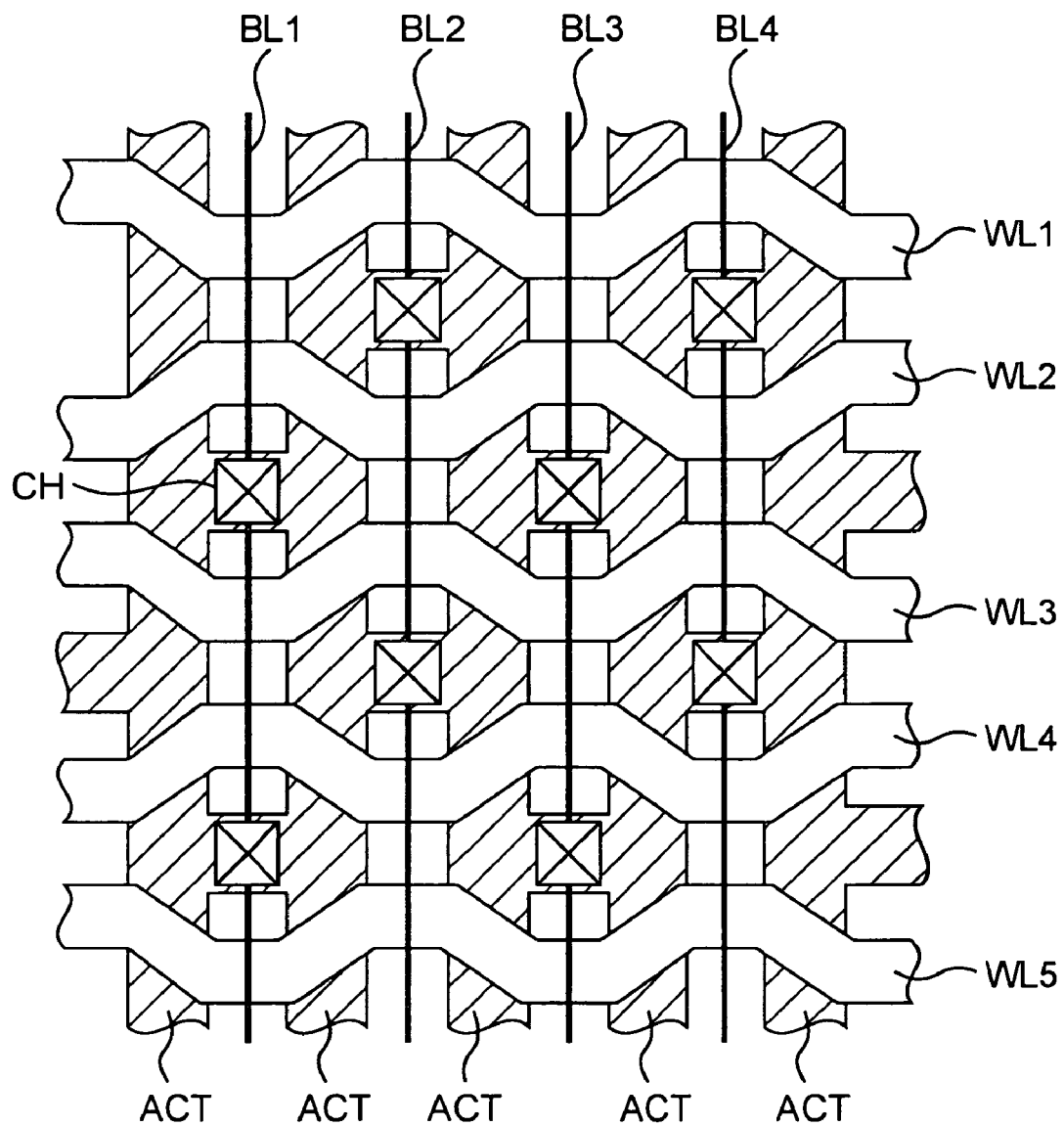
FIG. 35 is a schematic plan view of a modification of the memory cell array shown in FIG. 33.

FIG. 35 is a schematic plan view of another modification example of the memory cell array shown in FIG. 30. The memory cell array shown in FIG. 35 differs from the memory cell array shown in FIG. 30 in that the word lines WL1 through WL5 meander. With this arrangement, the distance between mutually adjacent word lines can be increased in the portion where the contact hole CH exists, and the distance between word lines can be reduced in the portions where no contact hole CH exists. Since the contact holes CH are provided one per two word lines with respect to the direction in which the bit lines are extended, the contact holes can be efficiently arranged by making the word lines meander. The memory cell array shown in FIG. 35 is allowed to have a reduced average distance between the word lines in comparison with the memory cell array shown in FIG. 30. Therefore, it is possible to reduce the memory cell area and thereby increase the packing density of the memory cell array.

Thirteenth Embodiment

A guiding principle in scaling an integrated circuit in which the aforementioned memory elements are provided in combination with logic transistors and examples of concrete scaling will be described below.

As already described, the manufacturing process of the memory element of the present invention has an extremely high affinity with the manufacturing process of the logic transistor. Therefore, an integrated circuit in which a memory section having the memory elements of the present invention is consolidated with a logic circuit section having logic transistors is important as an application of the semiconductor storage device of the present invention. The scaling of a logic transistor is predicted in ITRS (International Technology Roadmap for Semiconductors) 2001, according to which a half pitch is stated in the MPU ½ pitch section shown in FIGS. 37 through 39, and a physical gate length is stated in the L (logic) section. As is apparent from these statements, it is predicted that the physical gate length of the logic transistor will be rapidly shrunk in scale in the future. Furthermore, the width of the gate sidewall insulation film is also predicted in ITRS 2001, according to which the maximum value thereof is described as Wsw in FIGS. 37 through 39. As already described, the physical gate length of the memory element in the semiconductor storage device of the present invention can be remarkably shrunk in scale. However, since the width of the gate sidewall insulation film will also be reduced in accordance with the scale shrinkage of the logic transistor, it is important to keep an appropriate effective offset amount in scaling the memory element.

Figure 36:
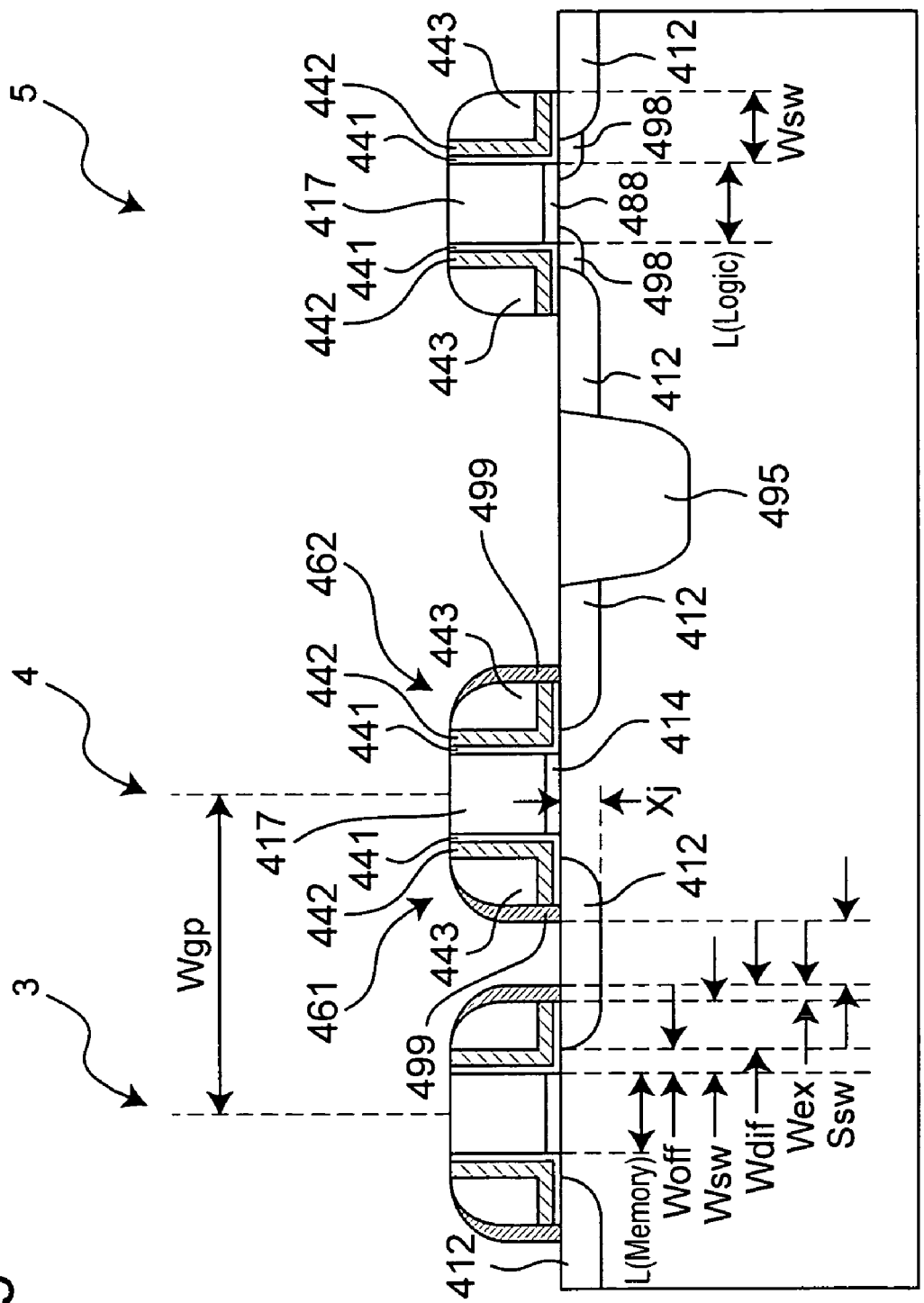
FIG. 36 is a view for explaining the scaling of an integrated circuit as a thirteenth embodiment of the present invention.

FIG. 36 is a diagram for explaining the scaling of an integrated circuit in which a memory section having the memory elements of the present invention is provided in combination with a logic circuit section having logic transistors. Memory devices 3 and 4 are the memory elements that constitute, for example, the memory cell array shown in FIGS. 30, 34 and 35. The following describes an example in which the gap Wgp between word lines (gate electrodes 417) is set to 3/2 pitches (three times the MPU ½ pitch of FIGS. 37 through 39). A logic transistor 5 is provided with an LDD (Lightly Doped Drain) 498, and the film thickness of the gate insulation film 488 may be different from the thickness of the gate insulation film 414 of the memory elements 3 and 4.

The sidewall insulation films of the memory elements 3 and 4 may have a construction in which an insulation film 499 is further added to the sidewall insulation film (constructed of a silicon nitride film 442 and silicon oxide films 441 and 443) of the logic transistor 5. The insulation film 499 is constructed of, for example, a silicon oxide film or a silicon nitride film. The insulation film 499 is to be added in order to increase only the gate sidewall insulation film thickness of the memory element when an offset amount Woff becomes insufficient for the production of a memory effect of a sufficient magnitude in accordance with the scaling of the memory element. With this arrangement, it is possible to obtain a sufficient memory effect by increasing the gate sidewall insulation film thickness of the memory element while keeping the gate sidewall insulation film thickness Wsw of the logic transistor as the predicted value of ITRS2001.

In the example of scaling below, the depth Xj of the diffusion region 412 is assumed to be same in the memory elements 3 and 4 and the logic transistor 5, and the size is assumed to follow the statement of ITRS2001. Moreover, the expansion Wdif in the transverse direction under the gate sidewall insulation film (including the insulation film 499 of a film thickness Wex) of the diffusion region 412 is empirically 0.7 times Xj of the depth of the diffusion region 412, and the scaling below follows it. That is, the offset amount Woff is obtained by subtracting the expansion Wdif in the transverse direction of the diffusion region 412 from the total gate sidewall insulation film thickness obtained by adding the gate sidewall insulation film thickness Wsw of the logic transistor 5 and the thickness Wex of the insulation film 499. It has been confirmed by device simulation that a memory effect of a sufficient magnitude is produced if there is secured an offset amount Woff of not smaller than 14 nm. Therefore, in the example of scaling below, the thickness of the oxide film 499 is determined so that the offset amount Woff becomes 14 nm at a minimum. It is to be noted that L (memory) represents the physical gate length of the memory elements 3 and 4 and Ssw represents a distance between the gate sidewall insulation films. For reference, the NOR type flash physical gate length predicted value L (flash NOR) stated in ITRS2001 is also shown in FIGS. 37 through 39.

FIG. 37 shows a first scaling example, in which the physical gate length L (memory) of the memory elements 3 and 4 is assumed to shrink similarly to the physical gate length L (logic) of the logic transistor 5. The distance Ssw between the gate sidewall insulation films is the largest among three scaling examples and exceeds half pitch in any of the years. The insulation film 499 will become needed after 2007 (half pitch: 65 nm).

FIG. 38 shows a second scaling example, in which the physical gate length of the memory element is not so drastically shrunk dissimilarly to the logic transistor and is equivalent to that of half pitch (MPU ½ pitch). In this case, since the physical gate length L (memory) of the memory element is comparatively great, the short-channel effect of the memory element is small, and a process examination for it is comparatively easy. However, since the distance Ssw between the gate sidewall insulation films (contact hole is arranged here) becomes smaller than half pitch, a self-alignment contact process becomes indispensable.

FIG. 39 shows a third scaling example, in which the distance Ssw between the gate sidewall insulation films is made equivalent to half pitch. In this case, the physical gate length L (memory) of the memory element assumes a value intermediate between those of the first and second scaling examples. This scaling example strikes a balance between the physical gate length of the memory element and a space for the contact hole.

What is very important in pursuing the scaling as shown in FIGS. 37 through 39 is that both of two diffusion regions of a memory element are effectively offset. In this case, the expression of "effectively offset" means that, when the memory function body is in a written, or programmed state (in which electrons are stored in the case of an n-channel type element, and holes are stored in the case of a p-channel type element), there is existing a region in which the surface of the semiconductor layer of a semiconductor substrate or the like has a depletion just under the memory function body. That is, in addition to the case where the end of the diffusion region is offset with respect to the gate electrode end, there is also included the case where a lowly doped diffusion region having a low concentration and a small thickness (shallow depth) exists in the surface of the semiconductor layer just under the memory function body, and the lowly doped diffusion region reaches the gate end. It is to be noted that a general LDD (Lightly Doped Drain) region is not included in this lowly doped diffusion region. The above is because the general LDD region does not have depletion even when the memory function body enters the written state, and therefore the memory effect is not produced. The general LDD region is formed by implanting, for example, $^{31}P^+$ions by $4\times10^{12}$ to $5\times10^{14}$ cm$^{-2}$ after the formation of the gate electrode. On the other hand, the lowly doped diffusion region can be further formed by a method of low dosage implantation or the like. The reason why it is preferable that both of the two diffusion regions of the memory element are offset will be described below.

First of all, due to the arrangement that both the two diffusion regions of the memory element are effectively offset, it becomes extremely easy to restrain the short-channel effect. Normally, the memory element is required to be operated with a voltage higher than that of the logic transistor, and the thickness of the gate insulation film 414 of the memory elements 3 and 4 is required to be greater than that of the gate insulation film 488 of the logic transistor 5. Therefore, it is extremely difficult to achieve scaling by setting equivalent half pitch of the memory section constructed of a memory element and the logic circuit section constructed of a logic transistor. However, the arrangement that both the two diffusion regions of the memory element are effectively offset becomes very advantageous for the short-channel effect, and the scaling as described above becomes possible.

Next, by virtue of the arrangement that both the two diffusion regions of the memory element are effectively offset, there is no need of a process for forming an LDD only in the diffusion region on one side. The arrangement that the LDD is located only in the diffusion region on one side means that, for example, LDDs are formed every other one of the diffusion regions 412 in FIG. 31. In order to form LDDs like this, it is required to mask the active regions opened between word lines every other one by a photoresist after the formation of the word lines (gate electrodes 417) and carry out ion implantation for the formation of the LDDs. However, it is difficult to form a dense photoresist pattern on a substrate that has significant unevenness due to the gate electrodes, and an extra margin is needed. If both the two diffusion regions of the memory element are effectively offset, there is no need of the process for forming the LDDs as described above, and the diffusion region can be formed in a self-aligning manner after the formation of the memory function body. Therefore, it is possible to increase the density of the memory cell array by reducing the memory cell area.

Furthermore, by virtue of the arrangement that both the two diffusion regions of the memory element are effectively offset, two-bit operation becomes possible. With this arrangement, it is possible to increase the density of the memory cell array by largely reducing the memory cell area per bit.

Fourteenth Embodiment

Figure 40:
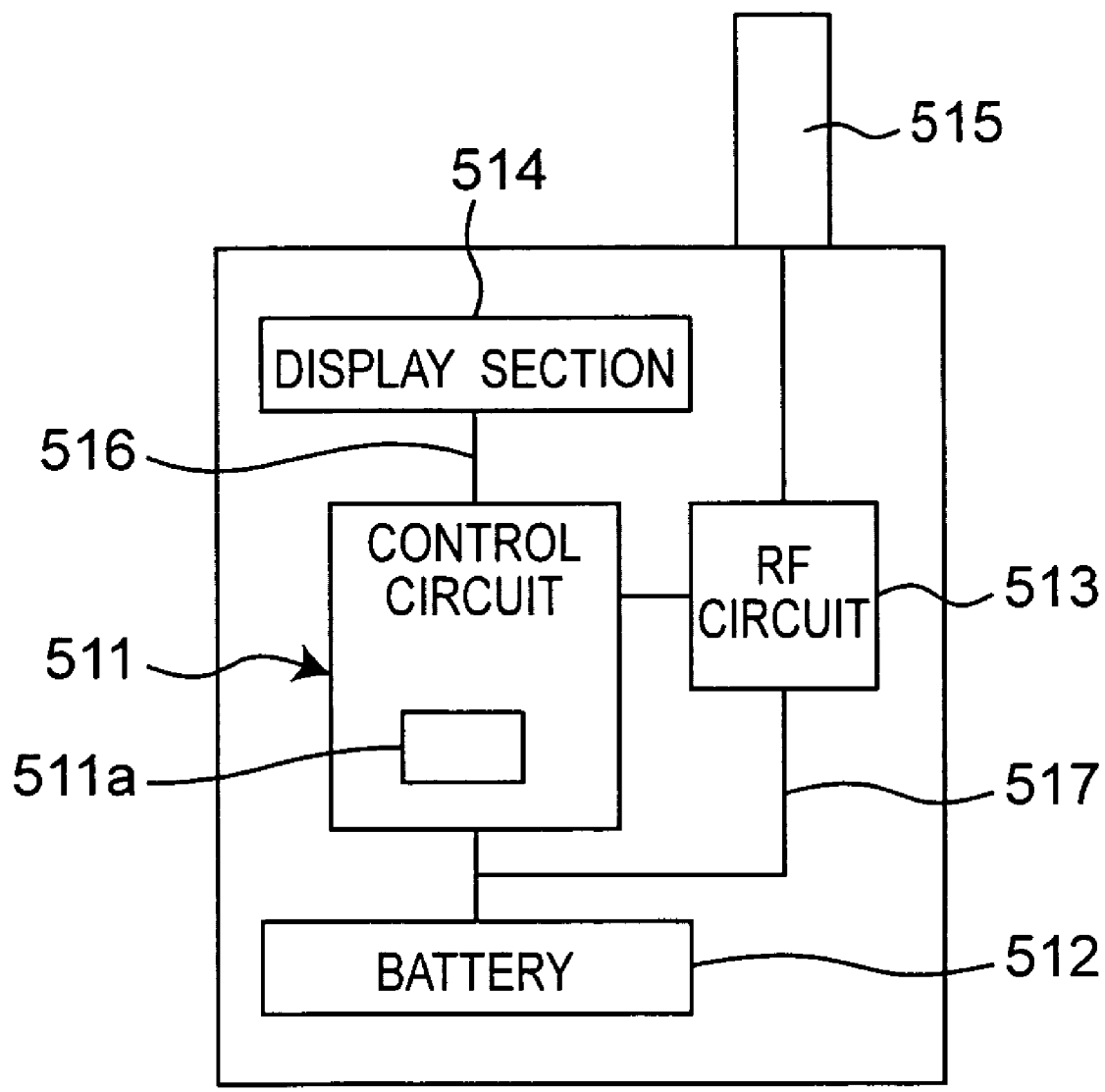
FIG. 40 is a block diagram of a portable telephone of a fourteenth embodiment as one example of the portable electronic equipment of the present invention.
Figure 41:
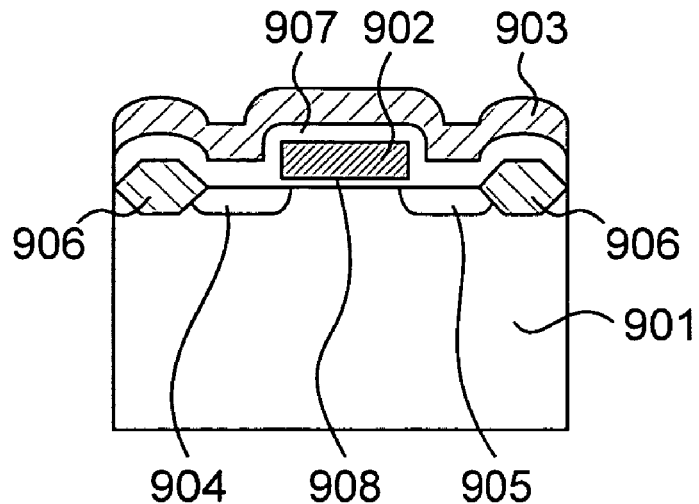
FIG. 41 is a schematic sectional view of an essential part of a conventional flash memory.

FIG. 40 shows a schematic block diagram of a portable telephone as one example of the portable electronic equipment of the present invention.

This portable telephone is constituted essentially of a control circuit 511, a battery 512, an RF (Radio Frequency) circuit 513, a display section 514, an antenna 515, a signal line 516 and a power line 517. A semiconductor storage device 511a according to any one of the foregoing embodiments is incorporated in the control circuit 511. The control circuit 511 should preferably be an integrated circuit where devices of an identical structure are concurrently used as memory circuit elements and logic circuit elements. This facilitates the manufacturing of integrated circuits and allows the manufacturing cost of the portable electronic equipment to be especially reduced.

As described above, by employing the semiconductor storage device that facilitates the fabricating process for the memory section and the logic circuit section in combination, that is easy to miniaturize, and that allows a high speed read operation, it is possible to improve the reliability and operating speed of the portable electronic equipment, reduce the size of the portable electronic equipment, and reduce the production costs.

What is claimed is:

1. A semiconductor storage device comprising:
a semiconductor layer;
a gate conductor formed on the semiconductor layer, said gate conductor consisting of a single gate electrode formed on the semiconductor layer with a gate insulation film disposed therebetween;
a channel region arranged under the gate electrode;
diffusion regions arranged on opposite sides of the channel region; and
memory function bodies formed on opposite sides of the gate electrode and having a function to retain electric charges, wherein
gate conductor functions for writing to, and erasing and reading from the semiconductor storage device are solely carried out with the single gate electrode.

2. A semiconductor storage device comprising:
a semiconductor layer;
a gate conductor formed on the semiconductor layer, said gate conductor consisting of a single gate electrode formed on the semiconductor layer with a gate insulation film disposed therebetween;
a channel region arranged under the gate electrode;
diffusion regions arranged on opposite sides of the channel region; and
two charge storage regions, each of the charge storage regions being in a shape of a film parallel to a surface of the semiconductor layer and existing over part of the channel region and part of a corresponding diffusion region, straddling a boundary therebetween, wherein
gate conductor functions for writing to, and erasing and reading from the semiconductor storage device are solely carried out with the single gate electrode.

3. A semiconductor storage device comprising:
a plurality of memory elements arranged along a word line, wherein two memory function bodies having a function to retain electric charges are formed so as to extend along the word line on opposite sides of the word line,
each of the plurality of memory elements comprising:
a semiconductor layer;
a gate conductor formed on the semiconductor layer, said gate conductor consisting of a single gate electrode and comprising a part of the word line;
a gate insulation film formed between the semiconductor layer and the part of the word line;
a channel region arranged under the part of the word line;
diffusion regions arranged on opposite sides of the channel region; and
a part of each of the memory function bodies that exists over part of the channel region and part of a corresponding diffusion region, straddling a boundary therebetween, wherein
gate conductor functions for writing to, and erasing and reading from each memory element are solely carried out with the single gate electrode.

4. The semiconductor storage device as claimed in claim 3, wherein
the word line consists of a single word line,
the memory function bodies we arranged only on both sides of the single word line, and
the memory function bodies are each comprised of one or more insulative materials.

5. The semiconductor storage device as claimed in claim 4, wherein a word line to be selected when information is rewritten to the memory element is only the single word line.

6. The semiconductor storage device as claimed in claim 1, wherein
each of the memory function bodies is comprised of one or more insulative materials, and
at least part of each memory function body is formed so as to overlap with part of the corresponding diffusion region.

7. The semiconductor storage device as claimed in claim 1, wherein the semiconductor layer is comprised of a SOI layer.

8. The semiconductor storage device as claimed in claim 1, wherein the semiconductor layer includes a well region.

9. The semiconductor storage device as claimed in claim 1, wherein each of the memory function bodies includes a charge retention film having a function of storing electric charges, and an insulator.

10. The semiconductor storage device as claimed in claim 9, wherein the charge retention film includes a first portion that has a surface roughly parallel to a surface of the gate insulation film.

11. The semiconductor storage device as claimed in claim 10, wherein the charge retention film includes a second portion extended roughly parallel to a side surface of the gate electrode.

12. The semiconductor storage device as claimed in claim 11, wherein the insulator includes an insulation film that separates the gate electrode from the second portion of the charge retention film extended roughly parallel to the side surface of the gate electrode.

13. The semiconductor storage device as claimed in claim 10, wherein the insulator includes an insulation film that separates the first portion of the charge retention film from the channel region or the semiconductor layer.

14. The semiconductor storage device as claimed in claim 13, wherein the insulation film that separates the first portion of the charge retention film from the channel region or the semiconductor layer has a film thickness, which is smaller than a film thickness of the gate insulation film and not smaller than 0.8 nm.

15. The semiconductor storage device as claimed in claim 13, wherein the insulation film that separates the first portion of the charge retention film from the channel region or the semiconductor layer has a film thickness, which is greater than a film thickness of the gate insulation film and not greater than 20 nm.

16. The semiconductor storage device as claimed in claim 1, wherein each diffusion region is effectively offset with respect to the gate electrode.

17. The semiconductor storage device as claimed in claim 3, wherein each diffusion region is effectively offset with respect to the word line.

18. The semiconductor storage device as claimed in claim 16, wherein each memory function body includes an insulation film formed on a remotest side from the gate electrode in order to secure a prescribed amount of offset of each diffusion region.

19. The semiconductor storage device as claimed in claim 17, wherein each memory function body comprises an insulation film formed on a remotest side from the word line in order to secure a prescribed amount of offset of each diffusion region.

20. Portable electronic equipment having the semiconductor storage device as claimed in claim 1.

21. The semiconductor storage device as claimed in claim 2, wherein the semiconductor layer is comprised of a SOI layer.

22. The semiconductor storage device as claimed in claim 2, wherein the semiconductor layer includes a well region.

23. The semiconductor storage device as claimed in claim 2, wherein each diffusion region is effectively offset with respect to the gate electrode.

24. Portable electronic equipment having the semiconductor storage device as claimed in claim 2.

25. The semiconductor storage device as claimed in claim 3, wherein the semiconductor layer is comprised of a SOI layer.

26. The semiconductor storage device as claimed in claim 3, wherein the semiconductor layer includes a well region.

27. The semiconductor storage device as claimed in claim 3, wherein each of the memory function bodies includes a charge retention film having a function of storing electric charges, and an insulator.

28. Portable electronic equipment having the semiconductor storage device as claimed in claim 3.

29. The semiconductor storage device as claimed in claim 1, wherein the gate electrode does not cover the memory function bodies.

30. The semiconductor storage device as claimed in claim 2, wherein the gate electrode does not cover the charge storage regions.

31. The semiconductor storage device as claimed in claim 3, wherein the word line does not cover the memory function bodies.

* * * * *